United States Patent
Ellis

(10) Patent No.: US 9,390,814 B2
(45) Date of Patent: Jul. 12, 2016

(54) FAULT DETECTION AND PREDICTION FOR DATA STORAGE ELEMENTS

(71) Applicant: SanDisk Enterprise IP LLC, Milpitas, CA (US)

(72) Inventor: Robert W. Ellis, Phoenix, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/454,683

(22) Filed: Aug. 7, 2014

(65) Prior Publication Data

US 2015/0270014 A1 Sep. 24, 2015

Related U.S. Application Data

(60) Provisional application No. 61/955,728, filed on Mar. 19, 2014.

(51) Int. Cl.
*G11C 29/04* (2006.01)
*G01R 31/28* (2006.01)
(Continued)

(52) U.S. Cl.
CPC ............ *G11C 29/04* (2013.01); *G01R 31/2843* (2013.01); *G11C 29/4401* (2013.01); *G11C 2029/0409* (2013.01); *G11C 2029/5006* (2013.01)

(58) Field of Classification Search
CPC .... G11C 29/04; G11C 16/3495; G11C 29/44; G11C 29/4401
USPC ...................................... 365/201, 185.09, 200
See application file for complete search history.

(56) References Cited

U.S. PATENT DOCUMENTS

| 4,173,737 A | 11/1979 | Skerlos et al. |
| 4,888,750 A | 12/1989 | Kryder et al. |

(Continued)

FOREIGN PATENT DOCUMENTS

| EP | 1 299 800 | 4/2003 |
| EP | 1 465 203 A1 | 10/2004 |

(Continued)

OTHER PUBLICATIONS

Barr, "Introduction to Watchdog Timers," Oct. 2001, 3 pgs.

(Continued)

*Primary Examiner* — Alexander Sofocleous
*Assistant Examiner* — Alfredo Bermudez Lozada
(74) *Attorney, Agent, or Firm* — Morgan, Lewis & Bockius LLP

(57) ABSTRACT

A circuit, configured to detect faults in an array of data storage elements, comprises: a resistor network; a switching network for selectively coupling a specified portion of the resistor network to the array of data storage elements; a current monitoring module, where the current monitoring module is operable to monitor current flow through the specified portion of the resistor network; and a control module coupled to the switching network and the current monitoring module. The control module is operable to control the switching network, so as to couple the specified portion of the resistor network to the array of data storage elements, and to determine whether one or more predefined characteristics of the output of the current monitoring module meet predetermined fault criteria. The control module is further operable to initiate one or more remedial actions, when the one or more predefined characteristics meet the predetermined fault criteria.

23 Claims, 13 Drawing Sheets

(51) Int. Cl.
*G11C 29/44* (2006.01)
*G11C 29/50* (2006.01)

(56) References Cited

U.S. PATENT DOCUMENTS

| | | | |
|---|---|---|---|
| 4,916,652 A | 4/1990 | Schwarz et al. | |
| 5,129,089 A | 7/1992 | Nielsen | |
| 5,270,979 A | 12/1993 | Harari et al. | |
| 5,329,491 A | 7/1994 | Brown et al. | |
| 5,381,528 A | 1/1995 | Brunelle | |
| 5,519,847 A | 5/1996 | Fandrich et al. | |
| 5,530,705 A | 6/1996 | Malone | |
| 5,537,555 A | 7/1996 | Landry | |
| 5,551,003 A | 8/1996 | Mattson et al. | |
| 5,636,342 A | 6/1997 | Jeffries | |
| 5,657,332 A | 8/1997 | Auclair et al. | |
| 5,666,114 A | 9/1997 | Brodie et al. | |
| 5,708,849 A | 1/1998 | Coke et al. | |
| 5,765,185 A | 6/1998 | Lambrache et al. | |
| 5,890,193 A | 3/1999 | Chevalier | |
| 5,936,884 A | 8/1999 | Hasbun et al. | |
| 5,943,692 A | 8/1999 | Marberg et al. | |
| 5,982,664 A | 11/1999 | Watanabe | |
| 6,000,006 A | 12/1999 | Bruce et al. | |
| 6,006,345 A | 12/1999 | Berry, Jr. | |
| 6,016,560 A | 1/2000 | Wada et al. | |
| 6,018,304 A | 1/2000 | Bessios | |
| 6,044,472 A | 3/2000 | Crohas | |
| 6,070,074 A | 5/2000 | Perahia et al. | |
| 6,119,250 A * | 9/2000 | Nishimura | G01R 31/3004 365/201 |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,295,592 B1 | 9/2001 | Jeddeloh et al. | |
| 6,311,263 B1 | 10/2001 | Barlow et al. | |
| 6,408,394 B1 | 6/2002 | Vander Kamp et al. | |
| 6,412,042 B1 | 6/2002 | Paterson et al. | |
| 6,442,076 B1 | 8/2002 | Roohparvar | |
| 6,449,625 B1 | 9/2002 | Wang | |
| 6,484,224 B1 | 11/2002 | Robins et al. | |
| 6,516,437 B1 | 2/2003 | Van Stralen et al. | |
| 6,564,285 B1 | 5/2003 | Mills et al. | |
| 6,678,788 B1 | 1/2004 | O'Connell | |
| 6,757,768 B1 | 6/2004 | Potter et al. | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,865,650 B1 | 3/2005 | Morley et al. | |
| 6,871,257 B2 | 3/2005 | Conley et al. | |
| 6,895,464 B2 | 5/2005 | Chow et al. | |
| 6,966,006 B2 | 11/2005 | Pacheco et al. | |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 7,020,017 B2 | 3/2006 | Chen et al. | |
| 7,028,165 B2 | 4/2006 | Roth et al. | |
| 7,032,123 B2 | 4/2006 | Kane et al. | |
| 7,043,505 B1 | 5/2006 | Teague et al. | |
| 7,076,598 B2 | 7/2006 | Wang | |
| 7,100,002 B2 | 8/2006 | Shrader et al. | |
| 7,102,860 B2 | 9/2006 | Wenzel | |
| 7,111,293 B1 | 9/2006 | Hersh et al. | |
| 7,126,873 B2 | 10/2006 | See et al. | |
| 7,133,282 B2 | 11/2006 | Sone | |
| 7,155,579 B1 | 12/2006 | Neils et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,275,170 B2 | 9/2007 | Suzuki | |
| 7,328,377 B1 | 2/2008 | Lewis et al. | |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,533,214 B2 | 5/2009 | Aasheim et al. | |
| 7,546,478 B2 | 6/2009 | Kubo et al. | |
| 7,566,987 B2 | 7/2009 | Black et al. | |
| 7,571,277 B2 | 8/2009 | Mizushima | |
| 7,574,554 B2 | 8/2009 | Tanaka et al. | |
| 7,596,643 B2 | 9/2009 | Merry et al. | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,765,454 B2 | 7/2010 | Passint | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,945,825 B2 | 5/2011 | Cohen et al. | |
| 7,954,041 B2 | 5/2011 | Hong et al. | |
| 7,971,112 B2 | 6/2011 | Murata | |
| 7,974,368 B2 | 7/2011 | Shieh et al. | |
| 7,978,516 B2 | 7/2011 | Olbrich | |
| 7,996,642 B1 | 8/2011 | Smith | |
| 8,006,161 B2 | 8/2011 | Lestable et al. | |
| 8,032,724 B1 | 10/2011 | Smith | |
| 8,041,884 B2 | 10/2011 | Chang | |
| 8,042,011 B2 | 10/2011 | Nicolaidis et al. | |
| 8,069,390 B2 | 11/2011 | Lin | |
| 8,190,967 B2 | 5/2012 | Hong et al. | |
| 8,250,380 B2 | 8/2012 | Guyot | |
| 8,254,181 B2 | 8/2012 | Hwang et al. | |
| 8,259,506 B1 | 9/2012 | Sommer et al. | |
| 8,312,349 B2 | 11/2012 | Reche et al. | |
| 8,412,985 B1 | 4/2013 | Bowers et al. | |
| 8,429,436 B2 | 4/2013 | Fillingim et al. | |
| 8,438,459 B2 | 5/2013 | Cho et al. | |
| 8,453,022 B2 | 5/2013 | Katz | |
| 8,627,117 B2 | 1/2014 | Johnston | |
| 8,634,248 B1 | 1/2014 | Sprouse et al. | |
| 8,694,854 B1 | 4/2014 | Dar et al. | |
| 8,724,789 B2 | 5/2014 | Altberg et al. | |
| 8,885,434 B2 | 11/2014 | Kumar | |
| 8,898,373 B1 | 11/2014 | Kang et al. | |
| 8,910,030 B2 | 12/2014 | Goel | |
| 8,923,066 B1 | 12/2014 | Subramanian et al. | |
| 9,128,690 B2 | 9/2015 | Lotzenburger et al. | |
| 2001/0050824 A1 | 12/2001 | Buch | |
| 2002/0024846 A1 | 2/2002 | Kawahara et al. | |
| 2002/0036515 A1 | 3/2002 | Eldridge et al. | |
| 2002/0083299 A1 | 6/2002 | Van Huben et al. | |
| 2002/0122334 A1 | 9/2002 | Lee et al. | |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid | |
| 2003/0079172 A1 | 4/2003 | Yamagishi et al. | |
| 2003/0088805 A1 | 5/2003 | Majni et al. | |
| 2003/0093628 A1 | 5/2003 | Matter et al. | |
| 2003/0163594 A1 | 8/2003 | Aasheim et al. | |
| 2003/0163629 A1 | 8/2003 | Conley et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0204341 A1 | 10/2003 | Guliani et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0057575 A1 | 3/2004 | Zhang et al. | |
| 2004/0062157 A1 | 4/2004 | Kawabe | |
| 2004/0073829 A1 | 4/2004 | Olarig | |
| 2004/0114265 A1 | 6/2004 | Talbert | |
| 2004/0143710 A1 | 7/2004 | Walmsley | |
| 2004/0148561 A1 | 7/2004 | Shen et al. | |
| 2004/0153902 A1 | 8/2004 | Machado et al. | |

(56) References Cited

U.S. PATENT DOCUMENTS

| | | |
|---|---|---|
| 2004/0167898 A1 | 8/2004 | Margolus et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0108588 A1 | 5/2005 | Yuan |
| 2005/0114587 A1 | 5/2005 | Chou et al. |
| 2005/0138442 A1 | 6/2005 | Keller, Jr. et al. |
| 2005/0154825 A1 | 7/2005 | Fair |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0069932 A1 | 3/2006 | Oshikawa et al. |
| 2006/0085671 A1 | 4/2006 | Majni et al. |
| 2006/0087893 A1 | 4/2006 | Nishihara et al. |
| 2006/0103480 A1 | 5/2006 | Moon et al. |
| 2006/0107181 A1 | 5/2006 | Dave et al. |
| 2006/0136570 A1 | 6/2006 | Pandya |
| 2006/0136681 A1 | 6/2006 | Jain et al. |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0113019 A1 | 5/2007 | Beukema |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujbayashi et al. |
| 2007/0180346 A1 | 8/2007 | Murin |
| 2007/0191993 A1 | 8/2007 | Wyatt |
| 2007/0201274 A1 | 8/2007 | Yu et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwall et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1* | 1/2008 | Zipprich-Rasch ............ 365/201 |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1 | 3/2009 | Kobayashi |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0204823 A1 | 8/2009 | Giordano et al. |
| 2009/0207660 A1 | 8/2009 | Hwang et al. |
| 2009/0213649 A1 | 8/2009 | Takahashi et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0115206 A1 | 5/2010 | de la Iglesia et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0199125 A1 | 8/2010 | Reche |
| 2010/0199138 A1 | 8/2010 | Rho |
| 2010/0202196 A1 | 8/2010 | Lee et al. |
| 2010/0202239 A1 | 8/2010 | Moshayedi et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0306222 A1 | 12/2010 | Freedman et al. |
| 2010/0332858 A1 | 12/2010 | Trantham et al. |
| 2011/0010514 A1 | 1/2011 | Benhase et al. |
| 2011/0022819 A1 | 1/2011 | Post et al. |
| 2011/0051513 A1 | 3/2011 | Shen et al. |
| 2011/0066597 A1 | 3/2011 | Mashtizadeh et al. |

(56) References Cited

U.S. PATENT DOCUMENTS

| | | |
|---|---|---|
| 2011/0066806 A1 | 3/2011 | Chhugani et al. |
| 2011/0072302 A1* | 3/2011 | Sartore ............... G06F 11/327 |
| | | 714/6.32 |
| 2011/0078407 A1 | 3/2011 | Lewis |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0138260 A1 | 6/2011 | Savin |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |
| 2011/0228601 A1 | 9/2011 | Olbrich et al. |
| 2011/0231600 A1 | 9/2011 | Tanaka et al. |
| 2011/0239077 A1 | 9/2011 | Bal et al. |
| 2011/0264843 A1 | 10/2011 | Haines et al. |
| 2011/0271040 A1 | 11/2011 | Kamizono |
| 2011/0283119 A1 | 11/2011 | Szu et al. |
| 2011/0289125 A1 | 11/2011 | Guthery |
| 2012/0011393 A1 | 1/2012 | Roberts et al. |
| 2012/0017053 A1 | 1/2012 | Yang et al. |
| 2012/0023144 A1 | 1/2012 | Rub |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0117317 A1 | 5/2012 | Sheffler |
| 2012/0117397 A1 | 5/2012 | Kolvick et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0173797 A1 | 7/2012 | Shen |
| 2012/0173826 A1 | 7/2012 | Takaku |
| 2012/0185750 A1 | 7/2012 | Hayami |
| 2012/0195126 A1 | 8/2012 | Roohparvar |
| 2012/0203951 A1 | 8/2012 | Wood et al. |
| 2012/0210095 A1 | 8/2012 | Nellans et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239976 A1 | 9/2012 | Cometti et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2013/0007073 A1 | 1/2013 | Varma |
| 2013/0007343 A1 | 1/2013 | Rub et al. |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0047045 A1 | 2/2013 | Hu et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0111279 A1 | 5/2013 | Jeon et al. |
| 2013/0111298 A1 | 5/2013 | Seroff et al. |
| 2013/0117606 A1 | 5/2013 | Anholt et al. |
| 2013/0121084 A1 | 5/2013 | Jeon et al. |
| 2013/0124888 A1 | 5/2013 | Tanaka et al. |
| 2013/0128666 A1 | 5/2013 | Avila et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0191601 A1 | 7/2013 | Peterson et al. |
| 2013/0194865 A1 | 8/2013 | Bandic et al. |
| 2013/0194874 A1 | 8/2013 | Mu et al. |
| 2013/0232289 A1 | 9/2013 | Zhong et al. |
| 2013/0238576 A1 | 9/2013 | Binkert et al. |
| 2013/0254507 A1 | 9/2013 | Islam et al. |
| 2013/0258738 A1 | 10/2013 | Barkon et al. |
| 2013/0265838 A1 | 10/2013 | Li |
| 2013/0282955 A1 | 10/2013 | Parker et al. |
| 2013/0290611 A1 | 10/2013 | Biederman et al. |
| 2013/0297613 A1 | 11/2013 | Yu |
| 2013/0301373 A1 | 11/2013 | Tam |
| 2013/0304980 A1 | 11/2013 | Nachimuthu et al. |
| 2013/0343131 A1 | 12/2013 | Wu et al. |
| 2013/0346672 A1 | 12/2013 | Sengupta et al. |
| 2014/0013188 A1 | 1/2014 | Wu et al. |
| 2014/0032890 A1 | 1/2014 | Lee et al. |
| 2014/0063905 A1 | 3/2014 | Ahn et al. |
| 2014/0075133 A1 | 3/2014 | Li et al. |
| 2014/0082261 A1 | 3/2014 | Cohen et al. |
| 2014/0082456 A1 | 3/2014 | Liu et al. |
| 2014/0095775 A1 | 4/2014 | Talagala et al. |
| 2014/0122818 A1 | 5/2014 | Hayasaka et al. |
| 2014/0122907 A1 | 5/2014 | Johnston |
| 2014/0136883 A1 | 5/2014 | Cohen |
| 2014/0136927 A1 | 5/2014 | Li et al. |
| 2014/0143505 A1 | 5/2014 | Sim et al. |
| 2014/0181458 A1 | 6/2014 | Loh et al. |
| 2014/0201596 A1 | 7/2014 | Baum et al. |
| 2014/0223084 A1 | 8/2014 | Lee et al. |
| 2014/0258755 A1 | 9/2014 | Stenfort |
| 2014/0269090 A1 | 9/2014 | Flynn et al. |
| 2014/0310494 A1 | 10/2014 | Higgins et al. |
| 2014/0359381 A1 | 12/2014 | Takeuchi et al. |
| 2015/0023097 A1 | 1/2015 | Khoueir et al. |
| 2015/0037624 A1 | 2/2015 | Thompson et al. |
| 2015/0153799 A1 | 6/2015 | Lucas et al. |

FOREIGN PATENT DOCUMENTS

| | | |
|---|---|---|
| EP | 1 990 921 A2 | 11/2008 |
| EP | 2 386 958 A1 | 11/2011 |
| EP | 2 620 946 A2 | 7/2013 |
| JP | 2002-532806 | 10/2002 |
| WO | WO 2007/036834 | 4/2007 |
| WO | WO 2007/080586 | 7/2007 |
| WO | WO 2008/075292 A2 | 6/2008 |
| WO | WO 2008/121553 | 10/2008 |
| WO | WO 2008/121577 | 10/2008 |
| WO | WO 2009/028281 | 3/2009 |
| WO | WO 2009/032945 | 3/2009 |
| WO | WO 2009/058140 | 5/2009 |
| WO | WO 2009/084724 | 7/2009 |
| WO | WO 2009/134576 | 11/2009 |
| WO | WO 2011/024015 | 3/2011 |

OTHER PUBLICATIONS

Canim, "Buffered Bloom Filters on Solid State Storage," ADMS*10, Singapore, Sep. 13-17, 2010, 8 pgs.

Kang, "A Multi-Channel Architecture for High-Performance NAND Flash-Based Storage System," J. Syst. Archit., vol. 53, Issue 9, Sep. 2007, 15 pgs.

Kim, "A Space-Efficient Flash Translation Layer for CompactFlash Systems," May 2002, IEEE vol. 48, No. 2, 10 pgs.

Lu, "A Forest-structured Bloom Filter with Flash Memory," MSST 2011, Denver, CO, May 23-27, 2011, article, 6 pgs.

Lu, "A Forest-structured Bloom Filter with Flash Memory," MSST 2011, Denver, CO, May 23-27, 2011, presentation slides, 25 pgs.

McLean, "Information Technology—AT Attachment with Packet Interface Extension," Aug. 19, 1998, 339 pgs.

Microchip Technology, "Section 10, Watchdog Timer and Power-Saving Modes," 2005, 14 pages.

Park et al., "A High Performance Controller for NAND Flash-Based Solid State Disk (NSSD)," Proceedings of Non-Volatile Semiconductor Memory Workshop, Feb. 2006, 4 pgs.

Zeidman, "Verilog Designer's Library," 1999, 9 pgs.

International Search Report and Written Opinion dated Jun. 6, 2013, received in International Patent Application No. PCT/US2012/

(56) References Cited

OTHER PUBLICATIONS 059447, which corresponds to U.S. Appl. No. 13/602,031, 12 pgs (Tai).
International Search Report and Written Opinion dated May 23, 2013, received in International Patent Application No. PCT/US2012/065914, which corresponds to U.S. Appl. No. 13/679,963, 7 pgs (Frayer).
International Search Report and Written Opinion, dated Mar. 19, 2009 received in International Patent Application No. PCT/US08/88133, which corresponds to U.S. Appl. No. 12/082,202, 7 pgs (Prins).
International Search Report and Written Opinion dated Feb. 19, 2009, received in International Patent Application No. PCT/US08/88236, which corresponds to U.S. Appl. No. 12/082,203, 7 pgs (Olbrich).
International Search Report and Written Opinion dated Feb. 19, 2009, received in International Patent Application No. PCT/US08/88217, which corresponds to U.S. Appl. No. 12/082,204, 7 pgs (Olbrich).
International Search Report and Written Opinion, dated Mar. 19, 2009, received in International Patent Application No. PCT/US08/88136, which corresponds to U.S. Appl. No. 12/082,205, 7 pgs (Olbrich).
International Search Report and Written Opinion dated Feb. 19, 2009, received in International Patent Application No. PCT/US08/88206, which corresponds to U.S. Appl. No. 12/082,206, 7 pgs (Prins).
International Search Report and Written Opinion dated Feb. 27, 2009, received in International Patent Application No. PCT/US2008/088154, which corresponds to U.S. Appl. No. 12/082,207, 8 pgs (Prins).
European Search Report dated Feb. 23, 2012, received in European Patent Application No. 08866997.3, which corresponds to U.S. Appl. No. 12/082,207, 6 pgs (Prins).
Office Action dated Apr. 18, 2012, received in Chinese Patent Application No. 200880127623.8, which corresponds to U.S. Appl. No. 12/082,207, 12 pgs (Prins).
Office Action dated Dec. 31, 2012, received in Chinese Patent Application No. 200880127623.8, which corresponds to U.S. Appl. No. 12/082,207, 9 pgs (Prins).
Notification of the Decision to Grant a Patent Right for Patent for Invention dated Jul. 4, 2013, received in Chinese Patent Application No. 200880127623.8, which corresponds to U.S. Appl. No. 12/082,207, 1 pg (Prins).
Office Action dated Jul. 24, 2012, received in Japanese Patent Application No. JP 2010-540863, 3 pgs (Prins).
International Search Report and Written Opinion dated Feb. 13, 2009, received in International Patent Application No. PCT/US08/88164, which corresponds to U.S. Appl. No. 12/082,220, 6 pgs (Olbrich).
International Search Report and Written Opinion dated Feb. 26, 2009, received in International Patent Application No. PCT/US08/88164, which corresponds to U.S. Appl. No. 12/082,221, 10 pgs (Prins).
International Search Report and Written Opinion dated Feb. 19, 2009, received in International Patent Application No. PCT/US08/88232, which corresponds to U.S. Appl. No. 12/082,222, 8 pgs (Olbrich).
International Search Report and Written Opinion dated Feb. 13, 2009, received in International Patent Application No. PCT/US08/88229, which corresponds to U.S. Appl. No. 12/082,223, 7 pgs (Olbrich).
International Search Report and Written Opinion dated Oct. 27, 2011, received in International Patent Application No. PCT/US2011/028637, which corresponds to U.S. Appl. No. 12/726,200, 13 pgs (Olbrich).

International Search Report and Written Opinion dated Aug. 31, 2012, received in International Patent Application No. PCT/US2012/042764, which corresponds to U.S. Appl. No. 13/285,873, 12 pgs (Frayer).
International Search Report and Written Opinion dated Mar. 4, 2013, received in International Patent Application No. PCT/US2012/042771, which corresponds to U.S. Appl. No. 13/286,012, 14 pgs (Stonelake).
International Search Report and Written Opinion dated Sep. 26, 2012, received in International Patent Application No. PCT/US2012/042775, which corresponds to U.S. Appl. No. 13/285,892, 8 pgs (Weston-Lewis et al.).
International Search Report and Written Opinion dated Jun. 6, 2013, received in International Patent Application No. PCT/US2012/059453, which corresponds to U.S. Appl. No. 12/602,039, 12 pgs (Frayer).
International Search Report and Written Opinion dated Feb. 14, 2013, received in International Patent Application No. PCT/US2012/059459, which corresponds to U.S. Appl. No. 13/602,047, 9 pgs (Tai).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
International Search Report and Written Opinion dated Apr. 5, 2013, received in International Patent Application No. PCT/US2012/065916, which corresponds to U.S. Appl. No. 13/679,969, 7 pgs (Frayer).
International Search Report and Written Opinion dated Jun. 17, 2013, received in International Patent Application No. PCT/US2012/065919, which corresponds to U.S. Appl. No. 13/679,970, 8 pgs (Frayer).
International Search Report and Written Opinion dated Jul. 25, 2014, received in International Patent Application No. PCT/US2014/029453, which corresponds to U.S. Appl. No. 13/963,444, 9 pages (Frayer).
Ashkenazi et al., "Platform independent overall security architecture in multi-processor system-on-chip integrated circuits for use in mobile phones and handheld devices," ScienceDirect, Computers and Electrical Engineering 33 (2007), 18 pages.
Invitation to Pay Additional Fees dated Feb. 13, 2015, received in International Patent Application No. PCT/US2014/063949, which corresponds to U.S. Appl. No. 14/135,433, 6 pages (Delpapa).
International Search Report and Written Opinion dated Mar. 9, 2015, received in International Patent Application No. PCT/US2014/059747, which corresponds to U.S. Appl. No. 14/137,440, 9 pages (Fitzpatrick).
International Search Report and Written Opinion dated Jan. 21, 2015, received in International Patent Application No. PCT/US2014/059748, which corresponds to U.S. Appl. No. 14/137,511, 13 pages (Dancho).
International Search Report and Written Opinion dated Feb. 18, 2015, received in International Patent Application No. PCT/US2014/066921, which corresponds to U.S. Appl. No. 14/135,260, 13 pages (Fitzpatrick).
Bayer, "Prefix B—Trees", ip.com Journal, ip.com Inc., West Henrietta, NY, Mar. 30, 2007, 29 pages.
Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.
Lee et al., "A Semi-Preemptive Garbage Collector for Solid State Drives," Apr. 2011, IEEE, pp. 12-21.

(56) References Cited

OTHER PUBLICATIONS

Oracle, "Oracle9i: Database Concepts", Jul. 2001, http://docs.oracle.com/cd/A91202_01/901_doc/server.901/a88856.pdf, 49 pages.

Office Action dated Feb. 17, 2015, received in Chinese Patent Application No. 201210334987.1, which corresponds to U.S. Appl. No. 12/082,207, 9 pages (Prins).

International Search Report and Written Opinion dated May 4, 2015, received in International Patent Application No. PCT/US2014/065987, which corresponds to U.S. Appl. No. 14/135,400, 12 pages (George).

International Search Report and Written Opinion dated Mar. 17, 2015, received in International Patent Application No. PCT/US2014/067467, which corresponds to U.S. Appl. No. 14/135,420, 13 pages (Lucas).

International Search Report and Written Opinion dated Apr. 20, 2015, received in International Patent Application No. PCT/US2014/063949, which corresponds to U.S. Appl. No. 14/135,433, 21 pages (Delpapa).

International Search Report and Written Opinion dated Jun. 8, 2015, received in International Patent Application No. PCT/US2015/018252, which corresponds to U.S. Appl. No. 14/339,072, 9 pages (Busch).

International Search Report and Written Opinion dated Jun. 2, 2015, received in International Patent Application No. PCT/US2015/018255, which corresponds to U.S. Appl. No. 14/336,967, 14 pages (Chander).

IBM Research—Zurich, "The Fundamental Limit of Flash Random Write Performance: Understanding, Analysis and Performance Modeling," Mar. 31, 2010, pp. 1-15.

Office Action dated Dec. 8, 2014, received in Chinese Patent Application No. 201180021660.2, which corresponds to U.S. Appl. No. 12/726,200, 7 pages (Olbrich).

Office Action dated Jul. 31, 2015, received in Chinese Patent Application No. 201180021660.2, which corresponds to U.S. Appl. No. 12/726,200, 9 pages (Olbrich).

International Search Report and Written Opinion dated Jun. 30, 2015, received in International Patent Application No. PCT/US2015/023927, which corresponds to U.S. Appl. No. 14/454,687, 11 pages (Kadayam).

International Search Report and Written Opinion dated Jul. 23, 2015, received in International Patent Application No. PCT/US2015/030850, which corresponds to U.S. Appl. No. 14/298,843, 12 pages (Ellis).

International Search Report and Written Opinion dated Sep. 14, 2015, received in International Patent Application No. PCT/US2015/036807, which corresponds to U.S. Appl. No. 14/311,152, 9 pages (Higgins).

Gasior, "Gigabyte's i-Ram storage device, Ram disk without the fuss," The Tech Report, p. 1, Jan. 25, 2006, 5 pages.

\* cited by examiner

Mapping 600

602   604-1   604-2

Mapping 610

| Portion | Age Category |
|---|---|
| 0 | 1 |
| 1 | 1 |
| 2 | 3 |
| 3 | 1 |
| 4 | 8 |
| 5 | 2 |
| 6 | 2 |
| 7 | 1 |
| 8 | 4 |
| 9 | 1 |
| ⋮ | ⋮ |
| n | 1 |

612 — Portion, 614 — Age Category

FAULT DETECTION AND PREDICTION FOR DATA STORAGE ELEMENTS

RELATED APPLICATIONS

This application claims priority to U.S. Provisional Patent Application No. 61/955,728, filed Mar. 19, 2014, which is hereby incorporated by reference in its entirety.

This application is also related to U.S. Provisional Patent Application No. 61/955,721, filed Mar. 19, 2014, and U.S. Provisional Patent Application No. 61/955,725, filed Mar. 19, 2014, all of which are hereby incorporated by reference in their entireties.

TECHNICAL FIELD

The disclosed embodiments relate generally to memory systems, and in particular, to detecting and predicting faults in data storage elements.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information. However, it is important to protect data integrity by detecting and/or predicting faults.

SUMMARY

Various implementations of systems, methods, circuits, and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to detect and/or predict faults within storage devices (e.g., solid state devices). In one aspect, a circuit is configured to detect faults in an array of data storage elements. The circuit comprises: (1) a resistor network comprising two or more resistors; (2) a switching network for selectively coupling a specified portion of the resistor network to the array of data storage elements; (3) a current monitoring module connected to the resistor network, wherein the current monitoring module is operable to monitor current flow through the specified portion of the resistor network; and (4) a control module coupled to the switching network and the current monitoring module. Where the control module is operable to control the switching network, so as to couple the specified portion of the resistor network to the array of data storage elements, and to determine whether one or more predefined characteristics of the output of the current monitoring module meet predetermined fault criteria. Where the control module is further operable to, in accordance with a determination that one or more predefined characteristics of the output of the current monitoring module meet predetermined fault criteria, initiate one or more remedial actions.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

Figure 1:
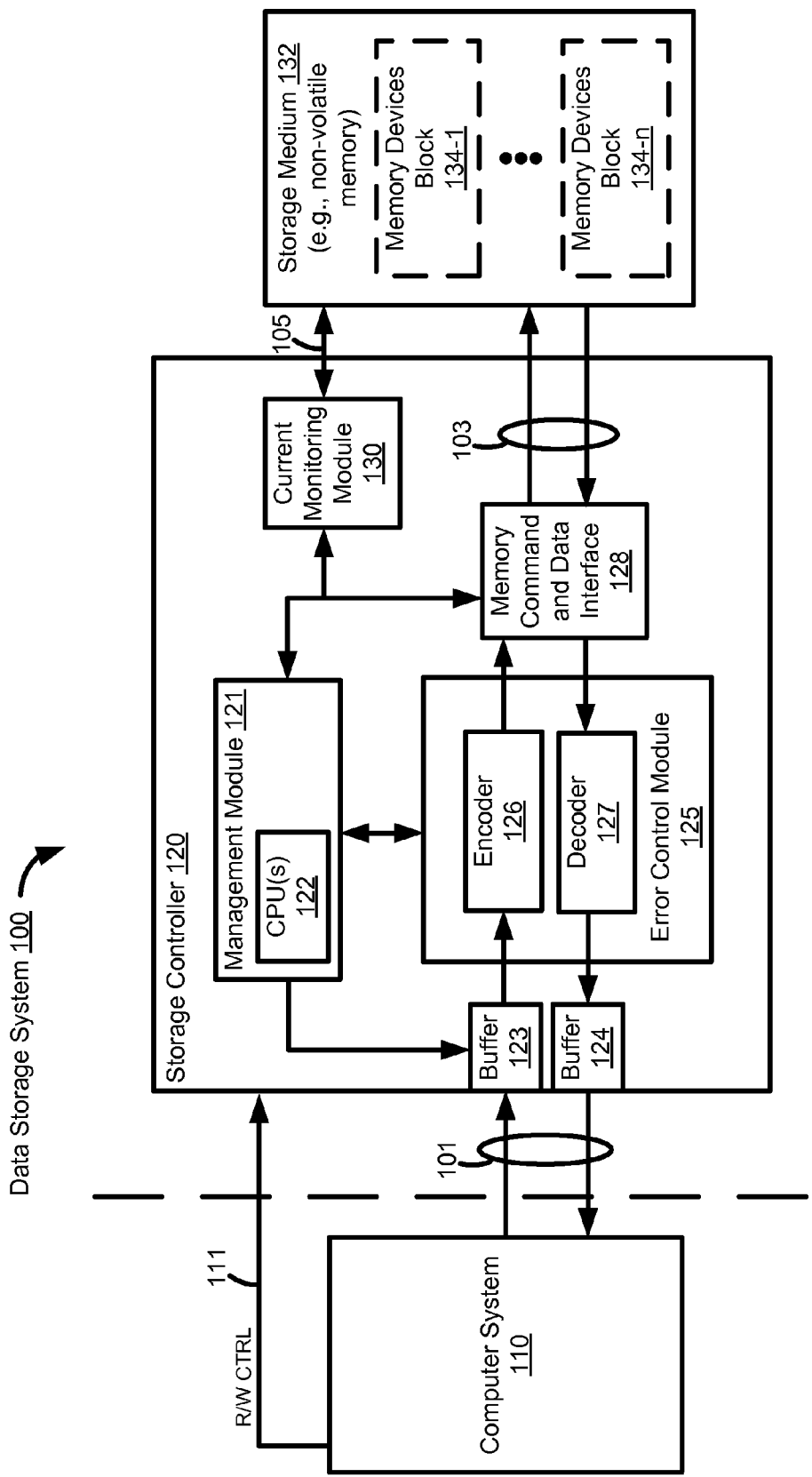
FIG. 1 is a block diagram illustrating an implementation of a data storage system in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include methods, systems, circuits, and/or devices used for fault detection and/or fault prediction in data storage elements. Some implementations include methods, systems, circuits, and/or devices to perform a fault detection operation.

More specifically, some implementations include a circuit to detect faults in an array of data storage elements. In some implementations, the circuit comprises: (1) a resistor network comprising two or more resistors; (2) a switching network for selectively coupling a specified portion of the resistor network to the array of data storage elements; (3) a current monitoring module connected to the resistor network, where the current monitoring module is operable to monitor current flow through the specified portion the resistor network; and (4) a control module coupled to the switching network and the current monitoring module. The control module is operable to control the switching network, so as to couple the specified portion of the resistor network to the array of data storage elements, and to determine whether one or more predefined characteristics of the output of the current monitoring module meet predetermined fault criteria. The control module is further operable to, in accordance with a determination that the one or more predefined characteristics meet the predetermined fault criteria, initiate one or more remedial actions.

In some embodiments, the circuit includes one or more three-dimensional (3D) data storage elements (e.g., memory devices 212, FIG. 2), as further defined herein. In some embodiments, the 3D data storage elements are coupled to a controller (e.g., storage controller 120, FIG. 1).

In some embodiments, the switching network is configured to selectively couple, in accordance with control signals determined by the control module, the specified portion of the resistor network to a specified portion of the array of data storage elements.

In some embodiments, the current monitoring module comprises a comparator and an amplifier, where the comparator is connected to the resistor network and wherein the amplifier comprises a first input coupled to an output of the comparator, a second input coupled to a reference voltage, and an output coupled to the control module; and the control module is further operable to analyze the output of the amplifier as instantaneous current data.

In some embodiments, the current monitoring module comprises a comparator and an amplifier, where the comparator is connected to the resistor network and wherein the amplifier comprises a first input coupled to an output of the comparator, a second input coupled to sample and hold circuitry, and an output coupled to the sample and hold circuitry and the control module; and the control module is further operable to analyze the output of the amplifier as peak current data.

In some embodiments, the current monitoring module comprises a first comparator, a second comparator, and a digital to analog converter (DAC), wherein the first comparator is connected to the resistor network, where the DAC comprises a first input coupled to a reference voltage and an output coupled to the second comparator, and wherein the second comparator comprises a first input coupled to the output of the first comparator, a second input coupled to the output of the DAC, and an output coupled to the control module; and the control module is further operable to analyze the output of the second comparator as adjusted current data.

In some embodiments, the current monitoring module comprises a comparator and an integrator, wherein the comparator is connected to the resistor network and wherein the integrator comprises a first input coupled to an output of the comparator, a second input coupled to a reference voltage, and an output coupled to the control module; and the control module is further operable to analyze the output of the integrator as average current data.

In some embodiments, the one or more remedial actions comprise marking the array of data storage elements as a known-bad storage array.

In some embodiments, the circuit further comprises a second array of data storage elements, wherein the switching network is further operable to couple a specified portion of the resistor network to the second array of data storage elements.

In some embodiments, the one or more remedial actions comprise: determining whether data stored in the array of data storage elements is valid; and, in accordance with a determination that the data stored in the specified portion is valid, transferring the data stored in the array of data storage elements to the second array of data storage elements.

In some embodiments, the one or more remedial actions further comprise, in accordance with a determination that the data stored in the array of data storage elements is invalid, obtaining recovered data corresponding to the data stored in the array of data storage elements and storing the recovered data to the second array of data storage elements.

In some embodiments, the control module is further operable to: determine whether one or more predefined characteristics of the recorded data meets predetermined warning criteria and does not meet predetermined fault criteria; and, in accordance with a determination that the recorded data meets the predetermined warning criteria and does not meet predetermined fault criteria, initiate one or more predictive actions.

In some embodiments, the one or more predictive actions comprise transferring the data stored in array of data storage elements to a second array of storage elements.

In some embodiments, the one or more predictive actions comprise marking the array of data storage elements as a known-bad array.

In some embodiments, the one or more predictive actions comprise updating metadata corresponding to the array of data storage elements.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of data storage system 100 in accordance with some embodiments. While some example features are illustrated, various other features have not been illustrated for the sake of brevity and so as not to obscure more pertinent aspects of the example embodiments disclosed herein. To that end, as a non-limiting example, data storage system 100 includes storage controller 120, and storage medium 132, and is used in conjunction with computer system 110. In some embodiments, storage medium 132 includes a plurality of memory devices (also sometimes called data storage elements). In some embodiments, the plurality of memory devices are non-volatile memory (NVM) devices such as such as a flash memory device or a magnetic disk drive, sometimes called a hard drive. In some embodiments, the plurality of memory devices comprises memory device blocks 134 (e.g., memory devices block 134-1 through memory devices block 134-*n*). In some embodiments, the plurality of memory devices comprises an array of data storage elements. In some embodiments, storage medium 132 includes a single memory device or a single memory device block. In some embodiments, storage medium 132 includes NAND-type flash memory or NOR-type flash memory. In some embodiments, storage medium 132 includes one or more three-dimensional (3D) memory devices, as further defined herein. Further, in some embodiments, storage controller 120 is a solid-state drive (SSD) controller. However, one or more other types of storage media may be included in accordance with aspects of a wide variety of embodiments.

Computer system 110 is coupled to storage controller 120 through data connections 101. However, in some embodiments computer system 110 includes storage controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some embodiments, computer system 110 includes one or more processors, one or more types of memory, a display and/or other user interface components such as a keyboard, a touch screen display, a mouse, a trackpad, a digital camera and/or any number of supplemental devices to add functionality.

In some embodiments, computer system 110 includes: one or more processing units (CPUs) for executing modules, programs and/or instructions stored in memory and thereby performing processing operations; memory; one or more network interfaces; and one or more communication buses for interconnecting these components. The one or more communication buses, optionally, include circuitry (sometimes called a chipset) that interconnects and controls communications between system components. Computer system 110 is operatively coupled with data storage system 100 by one or more communication buses. In some embodiments, computer system 110 also includes a user interface. The user interface includes one or more output devices that enable presentation of media content, including one or more speakers and/or one or more visual displays. The user interface also includes one or more input devices, including user interface components that facilitate user input such as a keyboard, a mouse, a voice-command input unit or microphone, a touch screen display, a touch-sensitive input pad, a gesture capturing camera, or other input buttons or controls. The memory includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. The memory, optionally, includes one or more storage devices remotely located from one or more CPUs. The memory, or alternatively the non-volatile memory device(s) within the memory, comprises a non-transitory computer readable storage medium. In some embodiments, the memory, or the non-transitory computer readable storage medium of the memory, stores the following programs, modules, and data structures, or a subset or superset thereof:

- an operating system including procedures for handling various basic system services and for performing hardware dependent tasks;
- a network communication module for connecting computer system 100 to data storage system 110 connected to one or more networks via one or more network interfaces (wired or wireless);
- a presentation module for enabling presentation of information (e.g., a user interface for a web page or an application program, audio and/or video content, text, etc.) at computer system 110 via one or more output devices (e.g., displays, speakers, etc.) associated with the user interface;
  - an input processing module for detecting one or more user inputs or interactions from one of the one or more input devices and interpreting the detected input or interaction;
  - a memory command module for issuing memory commands (e.g., read, write, and erase commands) to storage controller 120; and
- a management module for persisting data, including but not limited to:
  - a log entry module for generating a log entry associated with respective write data; and
  - a recovery module for performing a recovery process, or causing a recovery process to be performed, in response to detecting an error condition or synchronization command;
- optionally, one or more applications, such as one or more applications for providing services to client systems or other users of computer system 110, and which utilize storage medium 132, via storage controller 120, to persistently store data utilized by the one or more applications.

Storage medium 132 is coupled to storage controller 120 through connections 103 and 105. Connections 103 are sometimes called data connections, but typically convey commands in addition to data, and optionally convey metadata, error correction information and/or other information in addition to data values to be stored in storage medium 132 and data values read from storage medium 132. In some embodiments, however, storage controller 120 and storage medium 132 are included in the same device as components thereof. Furthermore, in some implementations storage controller 120 and storage medium 132 are embedded in a host device, such as a mobile device, tablet, other computer or computer controlled device, and the methods described herein are performed by the embedded storage controller. Storage medium 132 may include any number (i.e., one or more) of memory devices including, without limitation, non-volatile semiconductor memory devices, such as flash memory. As a non-limiting example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

In some embodiments, storage medium 132 is a persistent datastore (e.g., comprising non-volatile memory such as flash memory), and storage medium 132 includes a plurality of records 132 each including write data and a corresponding log entry. In some embodiments, each record corresponds to a transaction (e.g., a write operation) against the persistent datastore. In some embodiments, storage medium 132 also includes a log stream 134 comprising a plurality of log stream portions, where each log stream portion includes a log entry collection (e.g., 256 log entries). In some embodiments, storage medium 132 further includes one or more datastore snapshots 136. In some embodiments, each of one or more datastore snapshots 136 corresponds to the state(s) of one or more datastore tables at a point in time, where the one or more datastore tables enable the host to access data stored in the persistent datastore. For example, a snapshot of the one or more datastore tables is generated every N transactions (e.g., N=1000, 10000, etc.).

In some embodiments, storage medium 132 is divided into a number of addressable and individually selectable blocks (e.g., memory devices block 134-1). In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device. For example, one block comprises any number of pages, for example, 64 pages, 128 pages, 256 pages or another suitable number of pages. Blocks are typically grouped into a plurality of planes and/or zones. Each block plane or zone can be independently managed to some extent, which increases the degree of parallelism for parallel operations and simplifies management of storage medium 132.

In some embodiments, storage medium 132 includes metadata corresponding to respective portions of storage medium 132 (e.g., blocks, portions, pages, sectors, zones, and/or planes). In some embodiments, the metadata includes information regarding the health and/or age of the corresponding portion of storage medium 132 (e.g., an estimate of how many erase cycles may be performed before the portion fails). In some embodiments, storage medium 132 includes a mapping of known-bad portions of storage medium 132 (e.g., known-bad portions). In some embodiments, storage medium 132 includes a mapping of good portions of storage medium 132 (e.g., a mapping that excludes known-bad portions). In some embodiments, the metadata and/or mapping is stored in management module 121 (e.g., instead of storing in storage medium 132 or in addition to storing in storage medium 132).

In some embodiments, storage controller 120 includes management module 121, input buffer 123, output buffer 124, error control module 125, memory command and data interface 128, and current monitoring module 130. Storage controller 120 may include various additional features that have not been illustrated for the sake of brevity and so as not to obscure more pertinent features of the example embodiments disclosed herein, and that a different arrangement of features may be possible. Input and output buffers 123, 124 provide an interface to computer system 110 through data connections 101. Similarly, memory command and data interface 128 provides an interface to storage medium 132 though connections 103. In some embodiments, memory command and data interface 128 includes read and write circuitry, including circuitry capable of providing reading signals to storage medium 132 (e.g., reading threshold voltages for NAND-type flash memory). As will be discussed in greater detail below with reference to FIG. 2, current monitoring module 130 monitors electrical current flow across various components of storage medium 132 via connections 105.

In some embodiments, management module 121 includes one or more processing units (CPU(s), also sometimes called one or more processors) 122 configured to execute instructions in one or more programs (e.g., in management module 121). In some embodiments, one or more CPUs 122 are shared by one or more components within, and in some cases, beyond the function of storage controller 120. Management module 121 is coupled to input buffer 123, output buffer 124 (connection not shown), error control module 125, memory command and data interface 128, and current monitoring module 130 in order to coordinate the operation of these components.

Error control module 125 is coupled to memory command and data interface 128, input buffer 123 and output buffer 124. Error control module 125 is provided to limit the number of uncorrectable errors inadvertently introduced into data. In some embodiments, error control module 125 is executed in software by one or more CPUs 122 of management module 121, and, in other embodiments, error control module 125 is implemented in whole or in part using special purpose circuitry to perform encoding and decoding functions. To that end, error control module 125 includes an encoder 126 and a decoder 127. Encoder 126 encodes data by applying an error control code to produce a codeword, which is subsequently stored in storage medium 132.

When the encoded data (e.g., one or more codewords) is read from storage medium 132, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 132 from computer system 110 (e.g., write data). The data held in input buffer 123 is made available to encoder 126, which encodes the data to produce one or more codewords. The one or more codewords are made available to memory command and data interface 128, which transfers the one or more codewords to storage medium 132 in a manner dependent on the type of storage medium being utilized.

A read operation is initiated when computer system (host) 110 sends one or more host read commands on control line 111 to storage controller 120 requesting data from storage medium 132. Storage controller 120 sends one or more read access commands to storage medium 132, via memory command and data interface 128, to obtain raw read data in accordance with memory locations (addresses) specified by the one or more host read commands. Memory command and data interface 128 provides the raw read data (e.g., comprising one or more codewords) to decoder 127. If the decoding is successful, the decoded data is provided to output buffer 124, where the decoded data is made available to computer system 110. In some embodiments, if the decoding is not successful, storage controller 120 may resort to a number of remedial actions or provide an indication of an irresolvable error condition.

Figure 2:
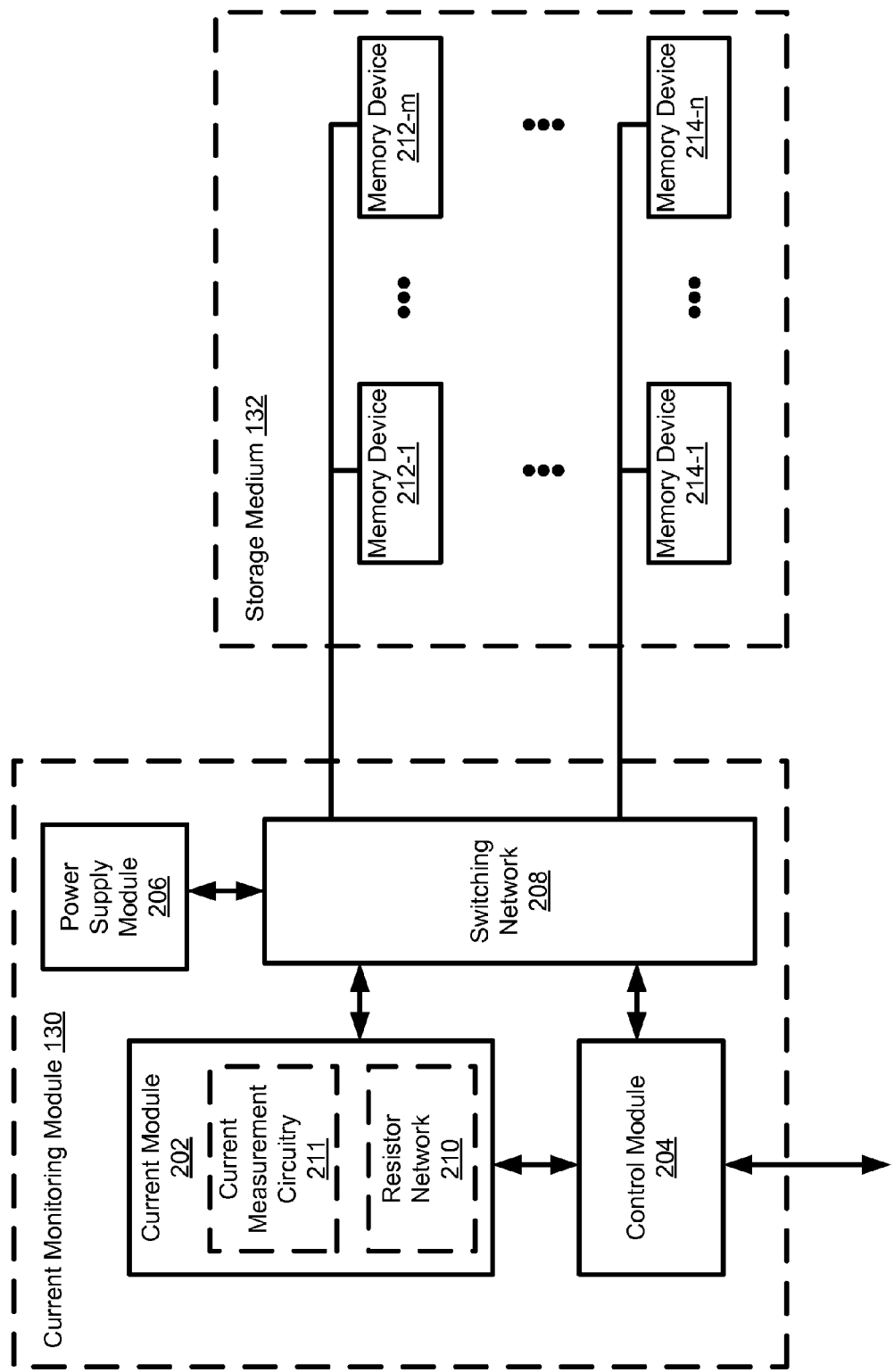
FIG. 2 is a block diagram illustrating an implementation of a current monitoring module in accordance with some embodiments.

FIG. 2 is a block diagram illustrating an implementation of current monitoring module 130 in accordance with some embodiments. Current monitoring module 130 typically includes: current module 202 for monitoring current in storage medium 132, control module 204 to coordinate the operation of other components and/or modules, power supply module 206 to supply power to storage medium 132, and switching network 208 to operably couple current module 202 and power supply module 206 to various portions of storage medium 132. In some embodiments, control module 204 coordinates the operation of other components (e.g., switching network 208 and current module 202) by executing instructions from management module 121 and/or computer system 110 (FIG. 1). In some embodiments, one or more functions (e.g., initiating a remedial action) described herein as being performed by control module 204 are instead performed by management module 121 of storage controller 120.

Switching network 208 comprises a plurality of switches (also sometimes called sense switches). The switches are, optionally, implemented via transistors, transmission gates, and the like. In some embodiments, the configuration of switching network 208 is determined by control module 204. In some embodiments, the configuration of switching network 208 is determined by management module 121 (FIG. 1).

Power supply module 206 provides power via switching network 208 to various components in storage medium 132 (e.g., memory device 212-1 through memory device 212-*m*). In some embodiments, control module 204 coordinates the operation of power supply module 206. In some embodiments, power supply module 206 provides power only to components of storage medium 132 that are coupled to current module 202. In other embodiments, power supply module 206 provides power to components of storage medium 132 that are not coupled to current module 202.

In some embodiments, current module 202 includes one or more sense amplifiers (not shown) for amplifying output from storage medium 132. In some embodiments, current module 202 includes resistor network 210 for adjusting gain across the inputs of current module 202. In some embodiments, current module 202 includes current measurement circuitry 211 for measuring current usage in storage medium 132. In some embodiments, current module 202 includes measurement circuitry (e.g., measurement circuitry 211) and software for measuring, analyzing, and/or recording the current drawn. Current module 202 monitors the current usage by various components of storage medium 132 (e.g., memory device 212-1 through memory device 212-*m*) via switching network 208. In some embodiments, the current data obtained by current module 202 is stored in memory (e.g., in management module 121 and/or storage medium 132). In some embodiments, current module 202 monitors and, optionally, records power usage by various components of storage medium 132.

In some embodiments, resistor network 210 includes one or more resistors (also sometimes called sense resistors) configured such that at least a subset of the one or more resistors is coupled to an output of storage medium 132. In some embodiments, the configuration of resistor network 210 is determined by control module 204. In some embodiments, at a given time during operation, control module 204 determines the configuration of resistor network 210 based on the particular portion of storage medium 132 connected to current module 202 via switching network 208.

In some embodiments, switching network 208 is configured (e.g., configured by control module 204) such that current module 202 is coupled to a first portion of storage medium 132 (e.g., memory devices 212) and power supply module 206 is coupled to a second portion of storage medium 132 (e.g., memory devices 212 and memory devices 214).

Current monitoring module 130 may include various additional features that have not been illustrated for the sake of brevity and so as not to obscure more pertinent features of the example embodiments disclosed herein, and that a different arrangement of features may be possible. For example, in some embodiments, current monitoring module 130 further includes memory for recording electrical current data. In some embodiments, current monitoring module 130 includes other combinations of hardware (e.g., current measurement circuitry 211) and software (e.g., programs) for monitoring and/or recording electrical current data.

Although FIG. 2 shows current monitoring module 130 and storage medium 132, FIG. 2 is intended more as functional descriptions of the various features which may be present in a management module, than as a structural schematic of the embodiments described herein. In practice, and as recognized by those of ordinary skill in the art, the programs, modules, and data structures shown separately could be combined and some programs, modules, and data structures could be separated.

Figure 3:
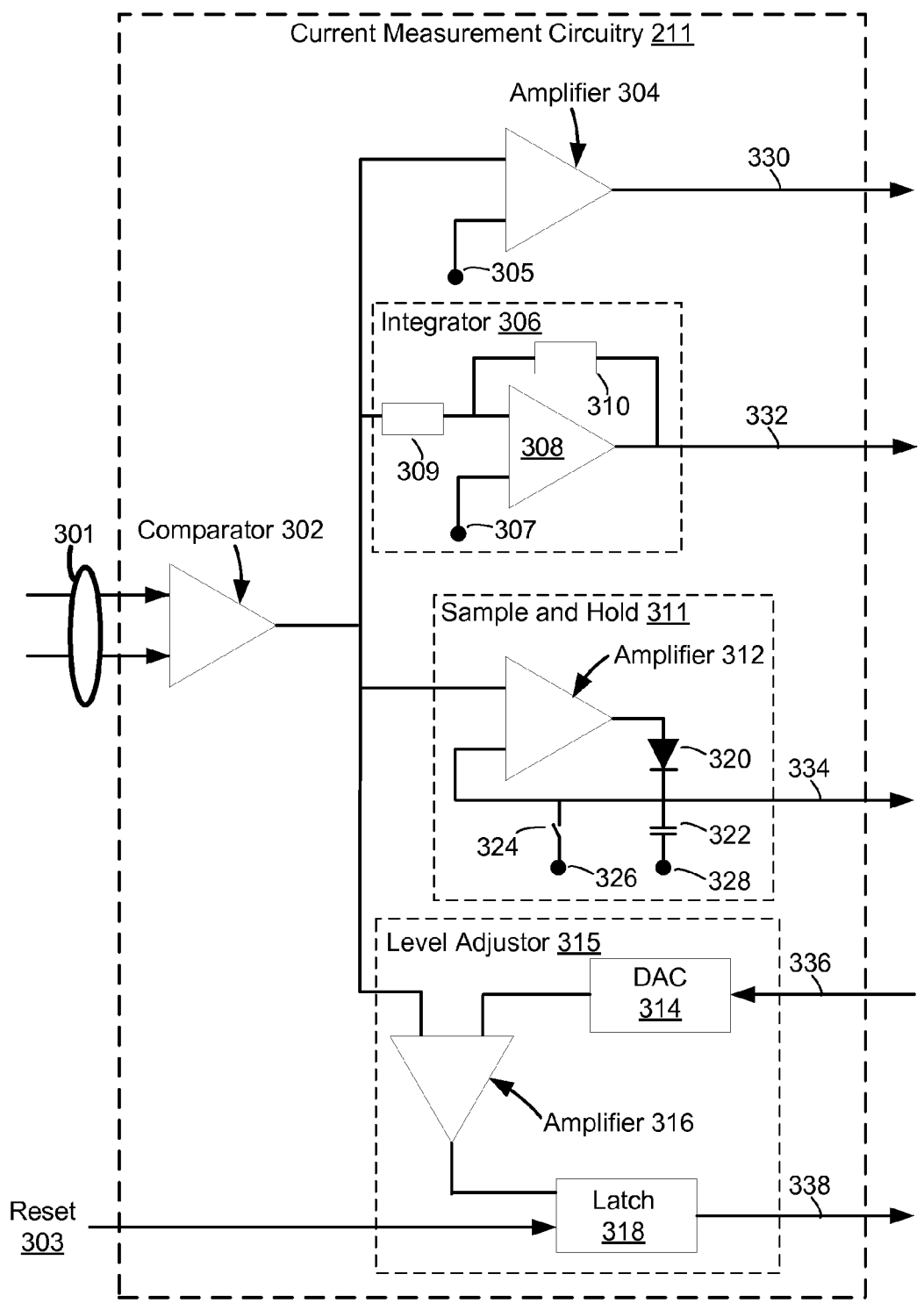
FIG. 3 is a block diagram illustrating an implementation of a current measurement circuitry in accordance with some embodiments.

FIG. 3 is a block diagram illustrating an implementation of current module 202 in accordance with some embodiments. Current measurement circuitry 211 typically includes circuitry for measuring instantaneous current and peak current and, optionally, includes circuitry for measuring average current, level-adjusted current, and various power measurements (not shown). Current measurement circuitry 211 is coupled to storage medium 132 via inputs 301. In some embodiments, current measurement circuitry 211 receives reset 303 and/or reference voltage 336 from control module 204. In some implementations, a voltage reference (e.g., reference 305) is generated by a voltage source and/or a current source.

In some embodiments, inputs 301 are coupled to one or more resistors in resistor network 210. For example, in some embodiments, resistor network 210 includes resistor R1 and is configured such that resistor R1 is coupled to the output of storage medium 132 via switching network 208. In this example, inputs 301 are coupled to opposite ends of resistor R1 such that comparator 302 measures the current across resistor R1.

Instantaneous current data is obtained from output 330 of amplifier 304. The first input of amplifier 304 is coupled to the output of comparator 302 and the second input of amplifier 304 is coupled to reference voltage 305. In some embodiments, current measurement circuitry 211 measures instantaneous current and other modules (e.g., current module 202) calculate average current, peak current, and/or level-adjusted current based on the measured instantaneous current.

Average current data is obtained from output 332 of integrator 306. In some embodiments, integrator 306 includes amplifier 308, resistor 309, capacitor 310, and reference voltage 307. In these embodiments, the first input of amplifier 308 is coupled to the output of comparator 302 via resistor 309; the second input of amplifier 308 is coupled to reference voltage 307; and output 332 of amplifier 308 is coupled to the first input of amplifier 308 via capacitor 310.

Peak current data is obtained from output 334 of sample and hold 311. In some embodiments, sample and hold 311 includes amplifier 321, reference voltages 326 and 328, capacitor 322, switch 324, and diode 320. In these embodiments, the first input of amplifier 312 is coupled to the output of comparator 302; the second input of amplifier 312 is coupled to output 334; the output of amplifier 312 is coupled to output 334 via diode 320; reference voltage 328 is coupled to output 334 via capacitor 322; and reference voltage 326 is coupled to output 334 via switch 324. In some implementations, reference voltage 326 is reference voltage 382.

Level-adjusted current is obtained from output 338 of level adjustor 315. In some embodiments, level adjustor 315 includes digital-to-analog-convertor (DAC) 314, amplifier 316, and latch 318. In these embodiments, the first input of amplifier 316 is coupled to the output of comparator 302; the second input of amplifier 316 is coupled to the output of DAC 314; the input of DAC 314 is connected to reference voltage 336; the output of amplifier 316 is coupled to the input of latch 318; and the output of latch 318 is coupled to output 338.

Figure 4A:
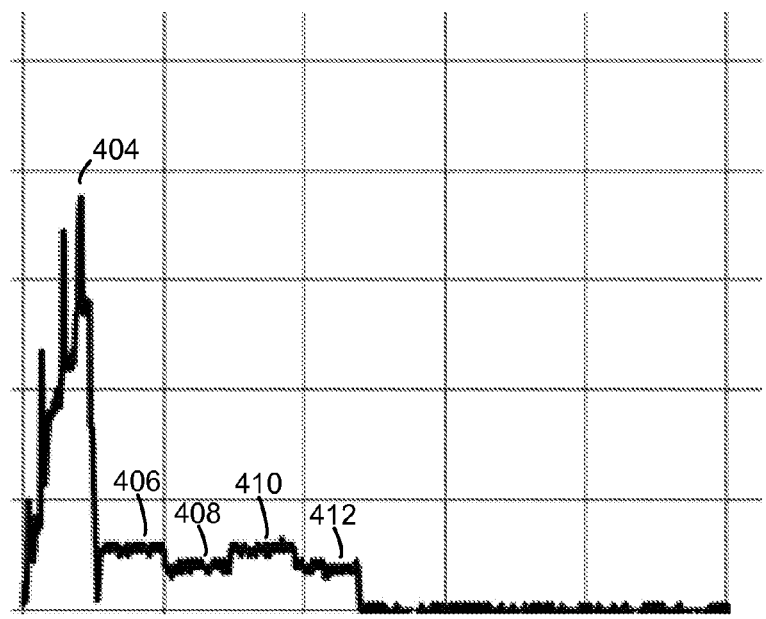
FIGS. 4A-4C are diagrams of current fingerprints corresponding to various operations within a storage device in accordance with some embodiments.
Figure 4B:
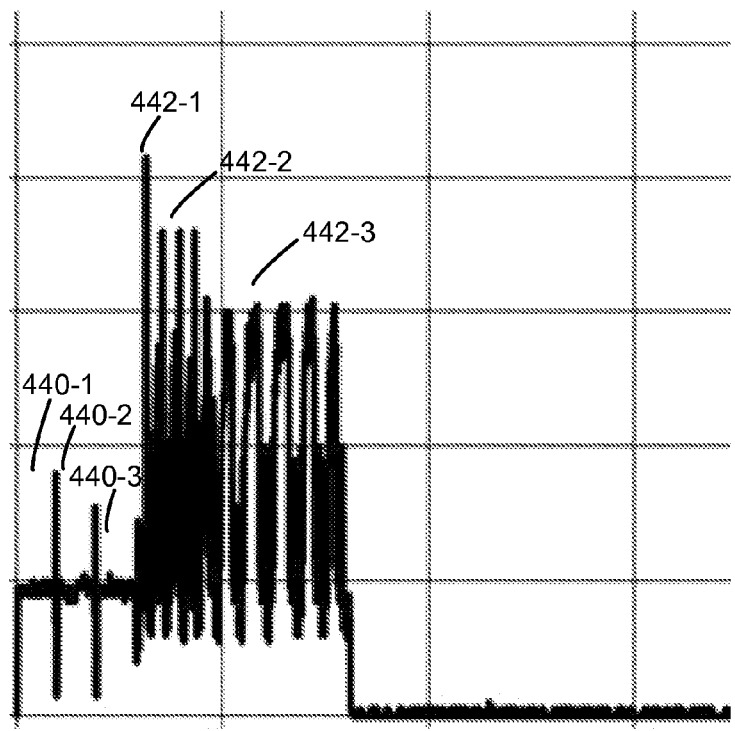
Figure 4C:
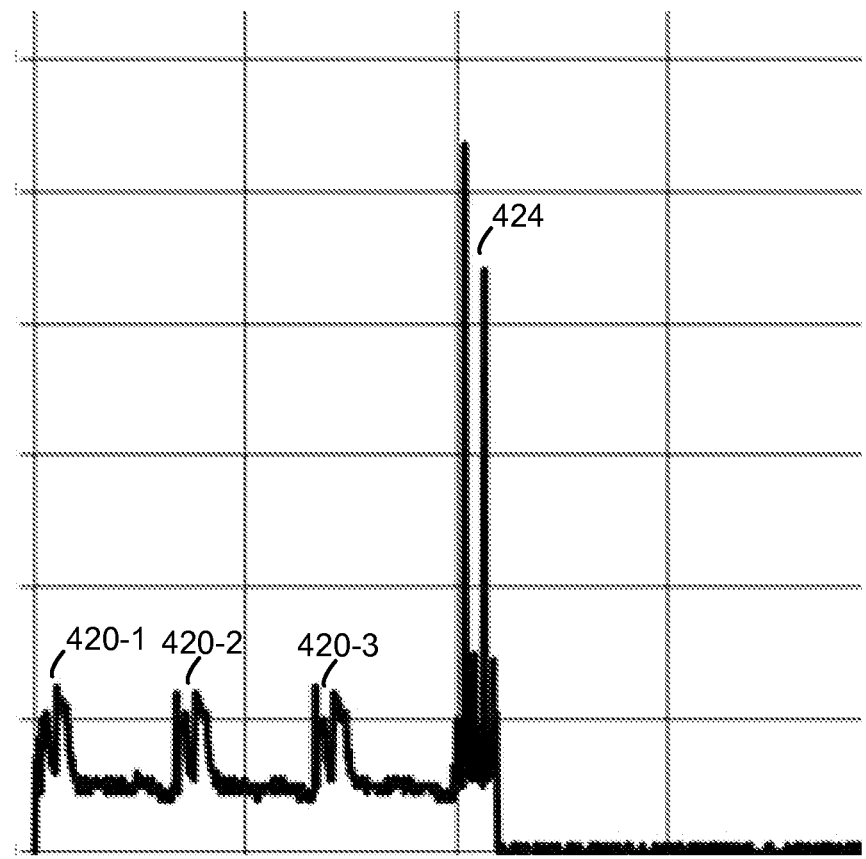

FIGS. 4A-4C are diagrams of current fingerprints corresponding to various operations within a storage device in accordance with some embodiments. As used herein, a current "fingerprint" means a trace of the electrical current drawn during a respective operation in a storage device (e.g., within storage medium 132, FIG. 1). The current fingerprints shown in FIGS. 4A-4C represent current drawn versus time elapsed for three distinct operations. A current curve during a respective operation (and a current curve during a particular phase of the respective operation) is predictable when the device is operating properly. The current curve determined from measurements of a successful operation is, optionally, used to determine target current values for use when analyzing the electrical current drawn by future operations of the same type. The y-axis of each of FIGS. 4A-4C represents current and the x-axis represents elapsed time.

The diagram in FIG. 4A corresponds to a multi-plane read operation (e.g., a read operation involving both plane 1 and plane 2). Phase 404 corresponds to reading data from storage medium 132 (e.g., reading data from memory devices 212-1 through 212-$m$ in FIG. 2). Phases 406 and 410 correspond to data transfer from plane 1 and phases 408 and 412 correspond to data transfer from plane 2. In some embodiments, average and peak current measurements are determined for each phase of the multi-plan read operation. In some embodiments, difference current between the planes is calculated by subtracting the average current corresponding to a first phase from the average current corresponding to a second phase (e.g., subtracting the average current corresponding to phase 408 from the average current corresponding to phase 406). In some embodiments, power corresponding to a particular phase is determined by integrating under the current curve for that phase (e.g., integrating the current curve in phase 404). In some embodiments, total time to complete a particular phase of the operation (e.g., phase 404) and/or total time to complete the operation is determined. The diagram in FIG. 4B corresponds to a write operation. Phases 440 correspond to data transfer to storage medium 132 and phases 442 correspond to data hardening within storage medium 132. The diagram in FIG. 4C corresponds to a non-transfer erase operation (e.g., the particular erase operation involves no data transfer). Phases 420 correspond to particular passes of the erase operation (e.g., phase 420-1 corresponds to the first pass). Phase 424 corresponds to the completion of the erase operation.

Figure 5A:
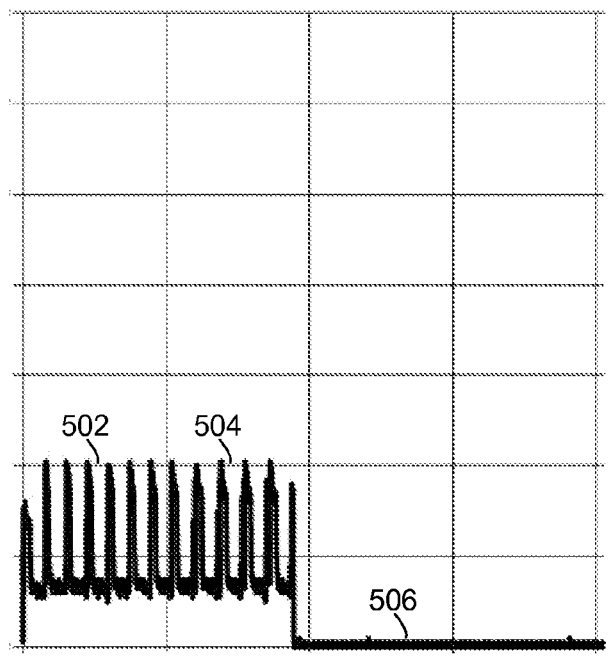
FIGS. 5A-5B are diagrams of current fingerprints corresponding to erase operations in accordance with some embodiments.
Figure 5B:
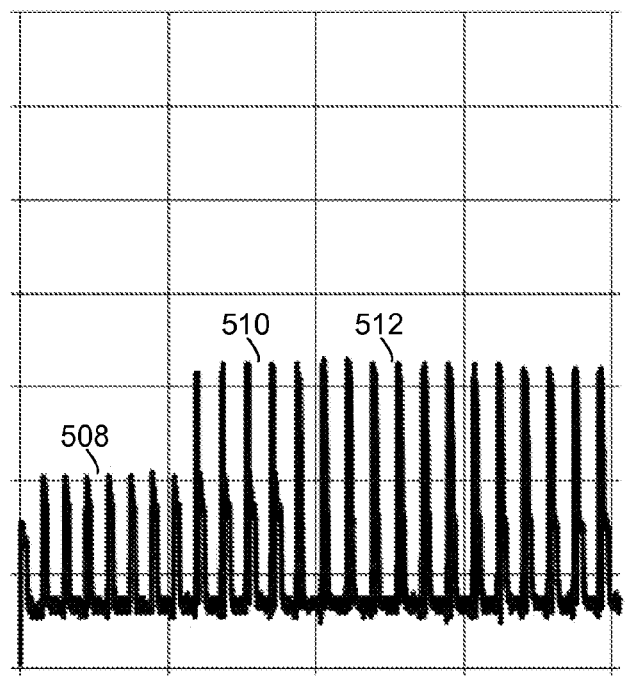

FIGS. 5A-5B are diagrams of current fingerprints corresponding to erase operations in accordance with some embodiments. The y-axis of each of FIGS. 5A-5C represents current and the x-axis represents elapsed time. FIG. 5A corresponds to a successful erase operation (e.g., a normal erase operation). FIG. 5B corresponds to a failed erase operation. Average current, peak current, phase completion time, operation completion time, and peak spacing are, optionally, used to determine that the erase operation in FIG. 5B has failed.

Figures 6A, 6B:
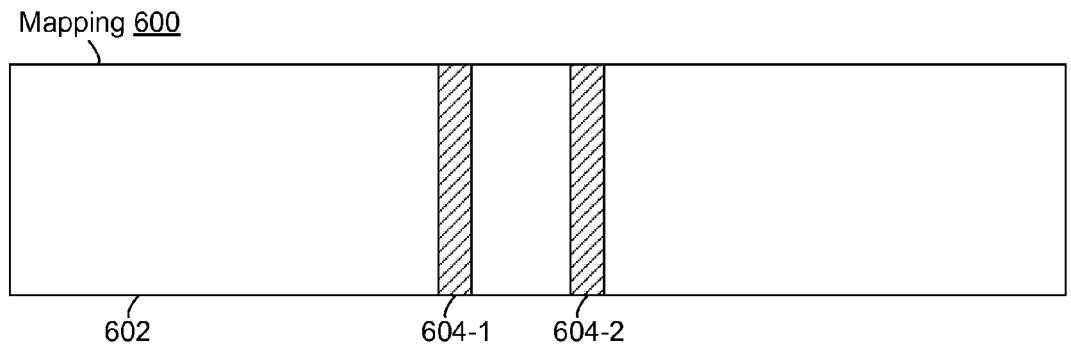
FIG. 6A is a conceptual illustration of a mapping of bad portions within a storage device in accordance with some embodiments.
FIG. 6B is a conceptual illustration of a mapping of particular portions and corresponding age categories within a storage device in accordance with some embodiments.

FIG. 6A is a conceptual illustration of mapping 600 in accordance with some embodiments. Mapping 600 maps memory 602 in a storage medium (e.g., storage medium 132 in FIG. 1). In some embodiments, mapping 600 is a logical to physical mapping (e.g., mapping 722 in FIG. 7). Known-bad portions 604-1 and 604-2 are marked in mapping 600. In some embodiments, known-bad portions 604 are excluded from mapping 600.

FIG. 6B is a conceptual illustration of mapping 610 in accordance with some embodiments. Mapping 610 maps particular portions within a storage medium (e.g., storage medium 132) and their corresponding age categories. In some embodiments, mapping 610 is a logical to physical mapping (e.g., mapping 722 in FIG. 7) that includes data corresponding to the respective age category for each physical portion.

Figure 7:
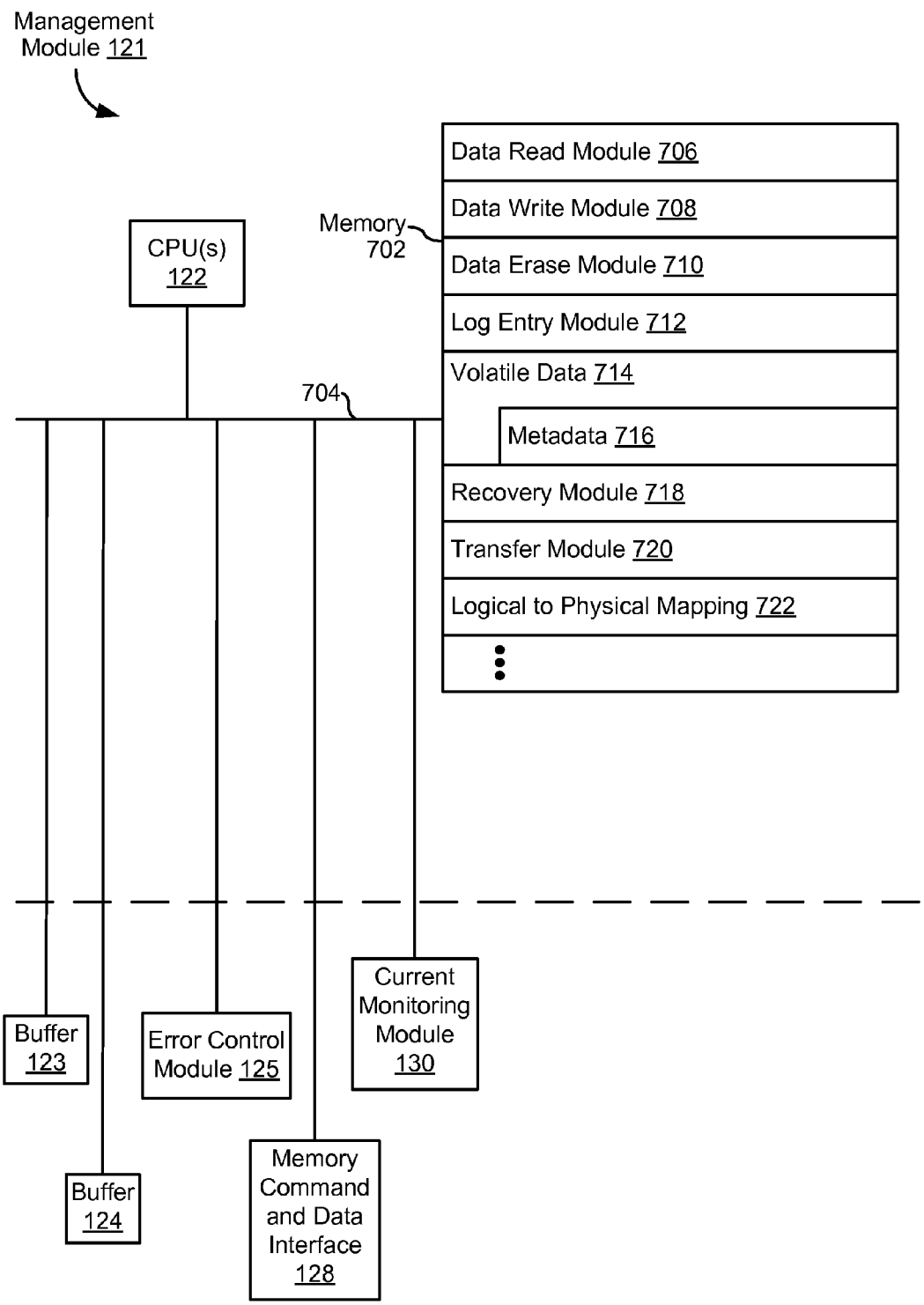
FIG. 7 is a block diagram illustrating an implementation of a management module in accordance with some embodiments.
Figure 8A:
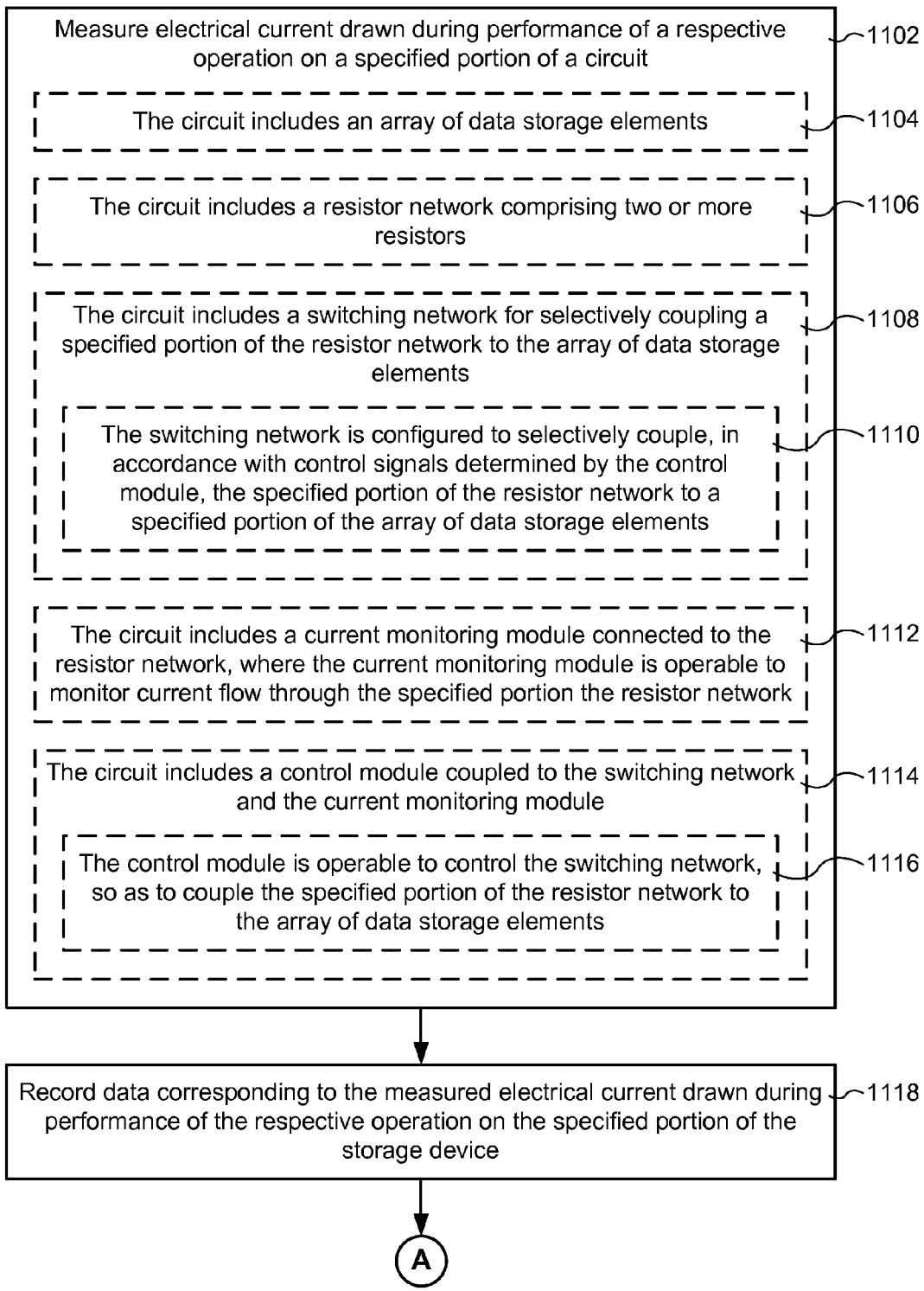
FIGS. 8A-8E illustrate a flowchart representation of a method of fault detection in data storage elements in accordance with some embodiments.
Figure 8B:
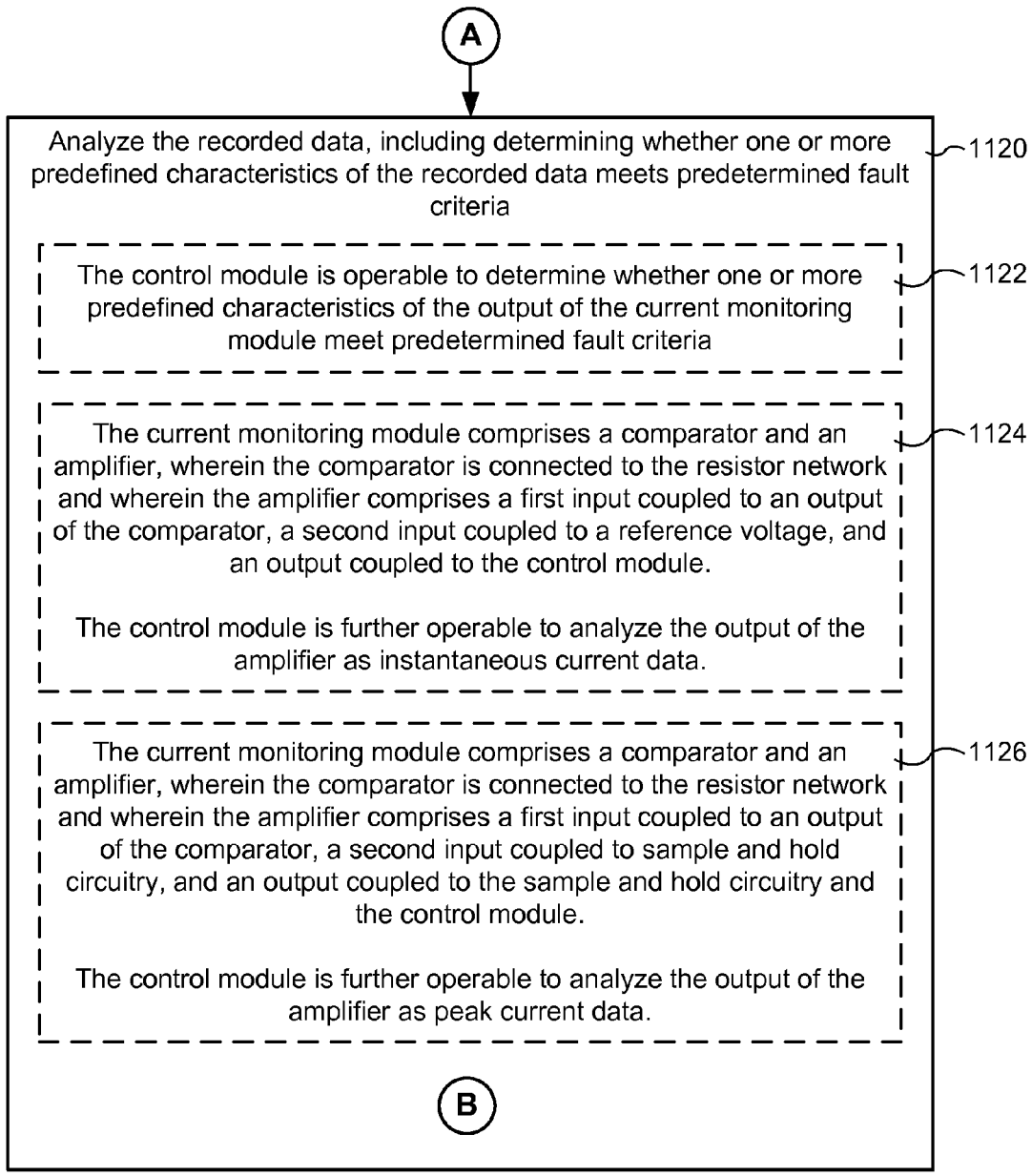
Figure 8C:
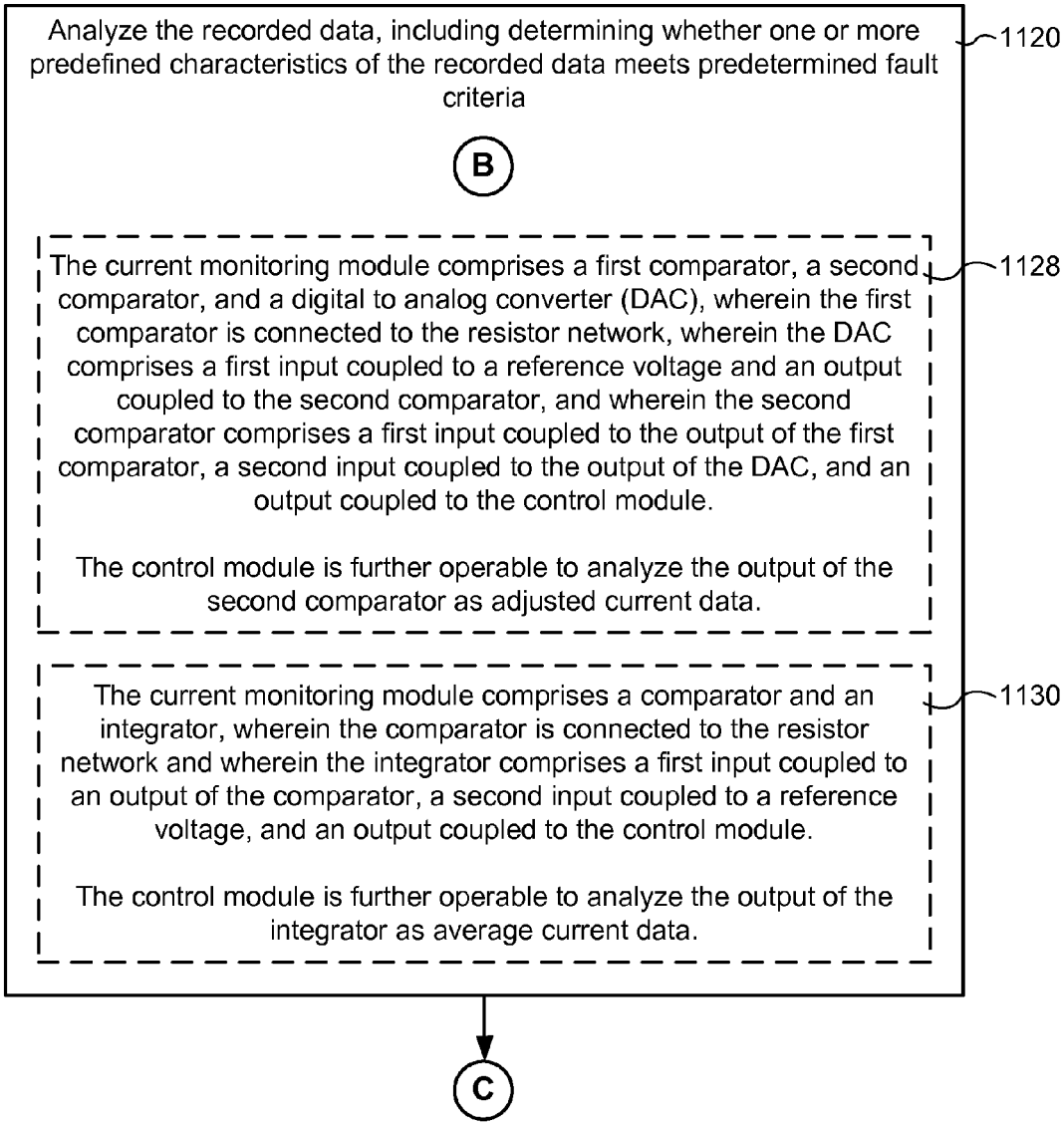
Figure 8D:
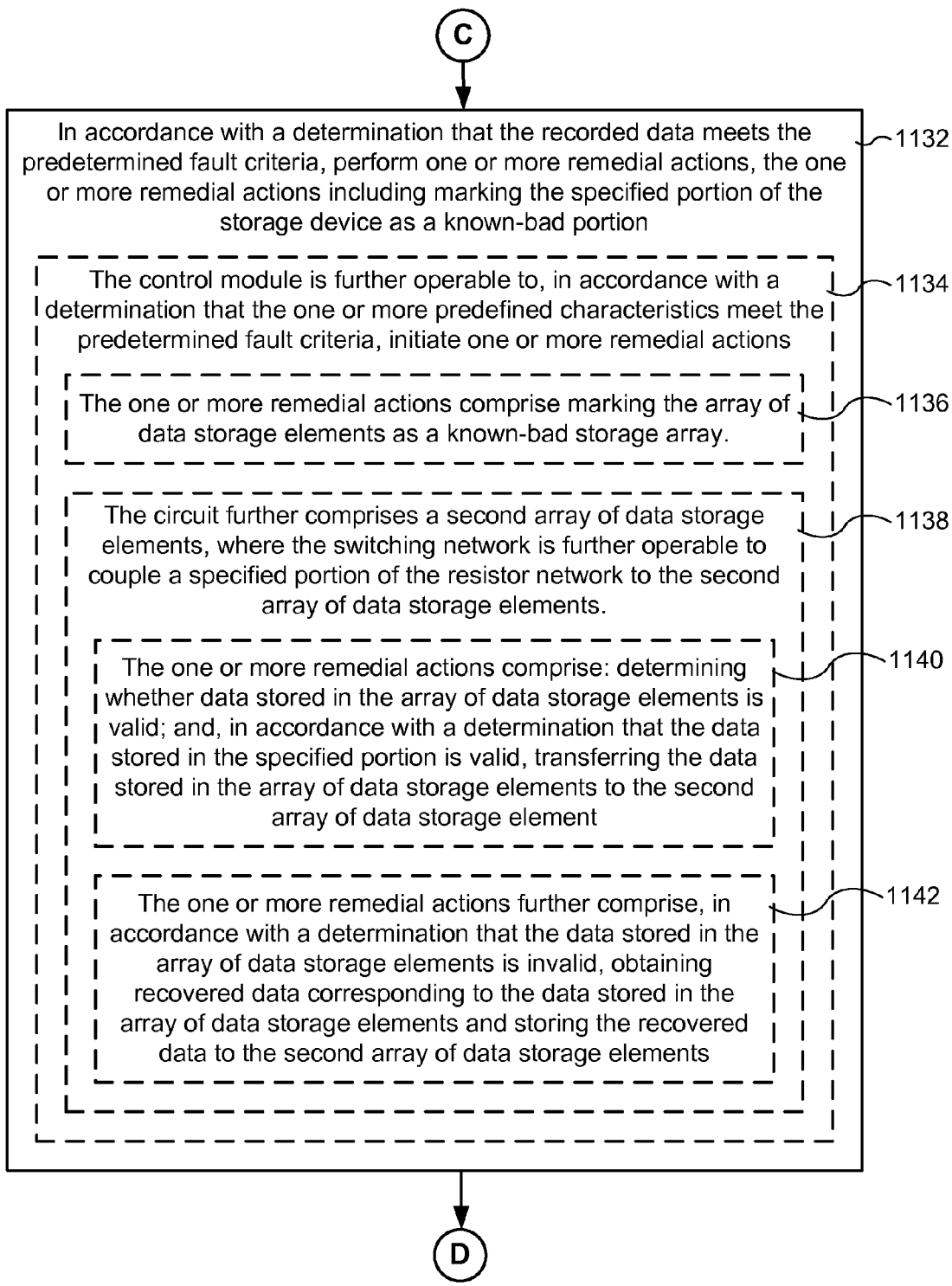
Figure 8E:
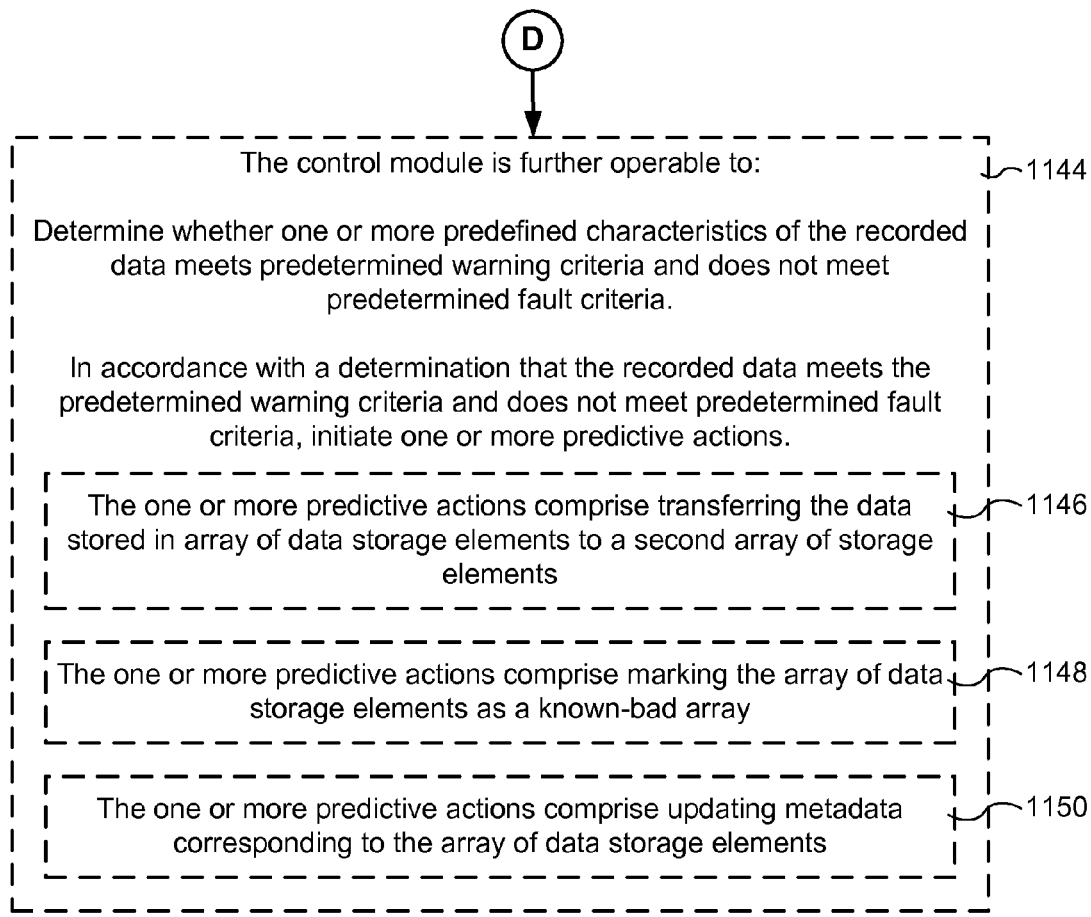

FIG. 7 is a block diagram illustrating an implementation of management module 121 in accordance with some embodiments. Management module 121 typically includes: one or more processing units (CPUs) 122 for executing modules, programs and/or instructions stored in memory 702 and thereby performing processing operations; memory 702; and one or more communication buses 704 for interconnecting these components. One or more communication buses 704, optionally, include circuitry (sometimes called a chipset) that interconnects and controls communications between system components. Management module 121 is operatively coupled with buffer 123, buffer 124, error control module 125, current monitoring module 130, and storage medium 132 (e.g., through memory command and data interface 128) by one or more communication buses 704. Memory 702 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. In some embodiments, memory 702 includes volatile data 714 corresponding to portions of storage medium 132. In some embodiments, memory 702 comprises metadata 716 (e.g., metadata comprising age category, known-bad portion, etc.) corresponding to portions of storage medium 132. Memory 702, optionally, includes one or more storage devices remotely located from one or more CPUs 122. Memory 702, or alternatively the non-volatile memory device(s) within memory 702, comprises a non-transitory computer readable storage medium. In some embodiments, memory 702, or the non-transitory computer readable storage medium of memory 702, stores the following programs, modules, and data structures, or a subset or superset thereof:

- data read module 706 for performing a read operation to read data from storage medium 132 (e.g., a persistent data store including non-volatile memory such as flash memory) according to a read command from computer system 110;
- data write module 708 for performing a write operation to write data (e.g., a record including write data and a log entry) to storage medium 132 according to a write command from computer system 110;
- data erase module 710 for performing an erase operation to erase data from storage medium 132 according to an erase command from computer system 110;
- log entry module 712 for generating a log entry associated with respective write data;
- recovery module 718 for performing a recovery process, or causing a recovery process to be performed, in response to detecting an error condition or synchronization command;
- transfer module 720 that is used for transferring data held in volatile memory to non-volatile memory; and
- logical to physical mapping 722, which maps logical addresses to physical addresses for respective portions of storage medium 132, and optionally also maps physical addresses for respective portions of storage medium 132 to logical addresses. In some embodiments, logical to physical mapping 722 excludes known-bad portions of storage medium 132 from the maps.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 702 stores a subset of the modules and data structures identified above. Furthermore, memory 702 may store additional modules and data structures not described above. In some embodiments, the programs, modules, and data structures stored in memory 702, or the non-transitory computer readable storage medium of memory 2702, provide instructions for implementing any of the methods described below with reference to FIGS. 8A-8E.

Although FIG. 7 shows management module 121, FIG. 7 is intended more as functional descriptions of the various features which may be present in a management module, than as a structural schematic of the embodiments described herein. In practice, and as recognized by those of ordinary skill in the art, the programs, modules, and data structures shown separately could be combined and some programs, modules, and data structures could be separated.

FIGS. 8A-8E illustrate a flowchart representation of method 1100 of fault detection in data storage elements, in accordance with some embodiments. In some embodiments, the method is performed by a circuit. In some embodiments, the circuit is a component in a storage device. In some embodiments, the storage device comprises a solid state device. In some embodiments, the storage device comprises a dual in-line memory module (DIMM) device. In some implementations, the storage device is compatible with a DIMM memory slot. In some implementations, the storage device comprises a storage controller (e.g., storage controller 120, FIG. 1) and a storage medium (e.g., storage medium 132, FIG. 1). In some embodiments, the circuit is a component in a storage controller (e.g., storage controller 120, FIG. 1).

The circuit measures (1102) electrical current drawn during performance of a respective operation on a specified portion of a circuit. For example, measuring electrical current drawn during performance of a respective operation (e.g., a write operation) on an array of data storage elements (e.g., memory devices 212, FIG. 2) in the circuit. In some implementations, current measurement circuitry (e.g., current measurement circuitry 211, FIG. 3) is used to measure the electrical current drawn.

In some embodiments, the circuit includes (1104) an array of data storage elements. For example, memory devices 214-1 through 214-n in FIG. 2. In some implementations, the data storage elements comprise a plurality of NAND devices. In some implementations, the data storage elements comprise a plurality of NOR devices. In some implementations, the array of data storage elements comprises one or more blocks, portions, pages, sectors, zones, and/or planes of data storage elements. In some implementations, the array of data storage elements is a component in a storage medium (e.g., storage medium 132, FIG. 2).

In some embodiments, the circuit includes (1106) a resistor network comprising two or more resistors. For example, resistor network 210 in FIG. 2. In some implementations, the resistor network comprises one or more variable resistors. In some implementations, the resistor network includes one or more inductive elements. In some implementations, the resistor network is an impedance network.

In some embodiments, the circuit includes (1108) a switching network for selectively coupling a specified portion of the resistor network to the array of data storage elements. For example, switching network 208, FIG. 2. In some implementations, the specified portion of the resistor network is a respective resistor. In some implementations, the switching network is further operable to selectively couple a power supply module (e.g., power supply module 206, FIG. 2) to the array of data storage elements.

In some embodiments, the switching network is configured (1110) to selectively couple, in accordance with control signals determined by a control module (e.g., control module 204), the specified portion of the resistor network to a specified portion of the array of data storage elements. For example, in some implementations, memory devices 212 in FIG. 2 are the array of data storage elements. In this example, switching network 208 is configured to selectively couple only memory devices (e.g., memory devices 212-1 to 212-m) in a first array of data storage elements to the specified portion of resistor network 210. In some implementations, the switching network is configured to: (A) couple a power supply module (e.g., power supply module 206) to the array of data storage elements; and (B) couple a specified portion of the resistor network to a specified portion of the array of data storage elements (e.g., a subset of the array).

In some embodiments, the circuit includes (1112) a current monitoring module (e.g., current module 202, FIG. 2) connected to the resistor network, where the current monitoring module is operable to monitor current flow through the specified portion the resistor network. In some implementations, the resistor network is a component of the current monitoring module. In some implementations, the specified portion of the resistor network is a resistor; the resistor is coupled to an output of the array of data storage elements; and the current monitoring module monitors current flow through the resistor. In some implementations, the current flow through the specified portion of the resistor network is the current drawn by the array of data storage elements.

In some embodiments, the circuit includes (1114) a control module (e.g., control module 204, FIG. 2) coupled to the switching network and the current monitoring module. In some implementations, the switching network and/or the current monitoring module are components of the control module. In some implementations, the control module comprises one or more processors. In some implementations, the control module includes volatile memory. In some implementations, the control module is in communication with (e.g., receives instructions from) a management module (e.g., management module 120, FIG. 1).

In some embodiments, the control module is operable (1116) to control the switching network, so as to couple the specified portion of the resistor network to the array of data storage elements. In some implementations, the specified portion of the resistor network is selected based on the impedance of the array of data storage elements. In some implementations, the specified portion of the resistor network is selected such that the current flow through the specified portion is within a predetermined range. In some implementations, the control module couples a first portion of the resistor network to the array of data storage elements during a first operation and couples a second portion of the resistor network to the array during a second operation.

The circuit records (1118) data corresponding to the measured electrical current drawn during performance of the respective operation on the specified portion of the storage device. In some implementations, the electrical current is determined and/or obtained in a current monitoring module (e.g., current module 202, FIG. 2) and recorded in memory. In some implementations, the circuit records the data in volatile memory (e.g., in memory 702, FIG. 7). In some implementations, the circuit records the data in a control module (e.g., control module 204, FIG. 2). In some implementations, the specified portion of the storage device is specified by a host system (e.g., computer system 110, FIG. 1) and is operably coupled to the current module via a switching network (e.g., switching network 208, FIG. 2). For example, referring to FIG. 2, in some implementations, the specified portion is a subset of memory devices 212 and the subset is coupled to current module 202 (e.g., is coupled to a resistor in resistor network 210) via switching network 208. In this example, power supply module 206 is coupled to the subset of memory devices 212 and is, optionally, coupled to other memory devices (e.g., memory devices 214) via switching network 208. Also, in this example, the configurations of switching network 208 and resistor network 210 are controlled by control module 204. In some implementations, the respective operation corresponds to a command sent from the host system. In some implementations, recording data corresponding to electrical current drawn during performance of a respective operation on a specified portion of the storage device comprises recording one or more outputs of current measurement circuitry (e.g., outputs 330, 332, 334, and 338 of current measurement circuitry 211 in FIG. 3). In some embodiments, the specified portion of the storage device includes, or is included in, one or more three-dimensional (3D) memory devices (e.g., memory device 212-1, FIG. 2).

The circuit analyzes (1120) the recorded data, including determining whether one or more predefined characteristics of the recorded data meets predetermined fault criteria. In some implementations, a control module (e.g., control module 204) analyzes the recorded data. In some implementations, analyzing the recorded data comprises comparing one or more predefined characteristics of the recorded data with one or more predefined characteristics of recorded data from a previous operation on the same portion. In some implementations, analyzing the recorded data comprises comparing one or more predefined characteristics of the recorded data with one or more predefined characteristics of recorded data from an operation on a different portion of the storage device. In some implementations, analyzing the recorded data comprises comparing one or more predefined characteristics of the recorded data with one or more preset boundaries. In some implementations, analyzing the recorded data comprises analyzing data corresponding to one or more outputs of current measurement circuitry (e.g., outputs 330, 332, 334, and 338 of current measurement circuitry 211 in FIG. 3).

In some embodiments, the control module is operable (1122) to determine whether one or more predefined characteristics of the output of the current monitoring module meet predetermined fault criteria. In some implementations, the current monitoring module includes current measurement circuitry (e.g., current measurement circuitry 211, FIG. 2) and the control module is operable to determine whether one or more outputs of the current measurement circuitry meet predetermined fault criteria. In some implementations, the predefined characteristics correspond to one or more of: operation completion timing data, cycle timing data, instantaneous current data, peak current data, floor current data, adjusted current data, difference current data, and average current data. For example, in FIG. 4A, operation completion timing is the time elapsed as phase 412 (i.e., the final phase of the operation) completes. Peak current, optionally, comprises the peak current (e.g., maximum current) during the entire operation (e.g., in FIG. 4A the peak current for the operation is obtained in phase 404) and/or the peak current for a particular phase of the operation (e.g., the peak current during phase 406 in FIG. 4A). Floor current, optionally, comprises the floor current (e.g., minimum current) during a particular phase of the operation and/or the floor current of the entire operation. Average current, optionally, comprises the average current during a particular phase of the operation (e.g., average current during phase 410 in FIG. 4A) and/or the average current of the entire operation. In some implementations, difference current comprises a current difference between two phases of the operation (e.g., the difference in average current between phases 406 and 408 in FIG. 4A). In some implementations, difference current comprises a current difference between operations on different portions of the storage device (e.g., different blocks, planes, or die of the storage device). For example, the difference in current between current drawn during a read operation performed on memory devices block 134-1 and current drawn during a read operation performed on memory devices block 134-n in FIG. 1. In some implementations, cycle timing is the time elapsed during a particular phase (e.g., phase 410) of the operation. In some implementations, cycle timing is the timing between successive current peaks during the operation (e.g., the timing between successive peaks in phase 442-3 in FIG. 4B).

In some embodiments, the current monitoring module comprises (1124) a comparator and an amplifier, wherein the comparator is connected to the resistor network and wherein the amplifier comprises a first input coupled to an output of the comparator, a second input coupled to a reference voltage, and an output coupled to the control module. The control module is further operable to analyze the output of the amplifier as instantaneous current data. For example, FIG. 3 shows comparator 302 connected to the resistor network via inputs 301. FIG. 3 also shows a first input of amplifier 304 connected to the output of comparator 302 and a second input of amplifier 304 connected to reference voltage 305. In this example, output 330, the output of amplifier 304, is coupled to the control module (e.g., control module 204, FIG. 2) such that the control module can analyze the instantaneous current data. In some implementations, comparator 302 is an operational amplifier. In some implementations, amplifier 304 is a comparator. In some implementations, inputs 301 are connected to opposite sides of a respective resistor in the resistor network such that the comparator is in parallel with the respective resistor.

In some embodiments, the current monitoring module comprises (1126) a comparator and an amplifier, wherein the comparator is connected to the resistor network (e.g., the inputs of the comparator are connected in parallel with the respective portion of the resistor network) and wherein the amplifier comprises a first input coupled to an output of the comparator, a second input coupled to sample and hold circuitry, and an output coupled to the sample and hold circuitry and the control module. The control module is further operable to analyze the output of the amplifier as peak current data. For example, FIG. 3 shows comparator 302 connected to the resistor network via inputs 301. FIG. 3 also shows the output of comparator 302 connected to sample and hold circuit 311. FIG. 3 shows sample and hold circuit 311 as comprising amplifier 312 where a first input of amplifier 312 is connected to the output of comparator 302 and a second input of amplifier 312 is coupled to sample and hold circuitry (e.g., diode 320, capacitor 322, and reference voltages 326 and 328). In this example, output 334, the output of sample and hold 311, is coupled to the control module (e.g., control module 204, FIG. 2) such that the control module can analyze the peak current data. In practice, and as recognized by those of ordinary skill in the art, the sample and hold circuitry could comprise additional components (e.g., transistors, capacitors, switches, diodes, and/or amplifiers). In some implementations, the sample and hold circuitry consists of an amplifier, a switch (e.g., a transmission gate), and a capacitor. In some implementations, the sample and hold circuitry comprises one or more reference voltages (e.g., reference voltages 326 and 328).

In some embodiments, the current monitoring module comprises (1128) a first comparator, a second comparator, and a digital to analog converter (DAC), wherein the first comparator is connected to the resistor network, wherein the DAC comprises a first input coupled to a reference voltage (e.g., an analog reference voltage) and an output coupled to the second comparator, and wherein the second comparator comprises a first input coupled to the output of the first comparator, a second input coupled to the output of the DAC, and an output coupled to the control module. The control module is further operable to analyze the output of the second comparator as adjusted current data. In some implementations, the output of the amplifier is latched and the output of the latch is coupled to the control module. In some implementations, the current monitoring module includes a reset signal (e.g., reset 303) used to reset the data stored in the latch. In some implementations, the second comparator is an amplifier. For example, FIG. 3 shows comparator 302 connected to the resistor network via inputs 301. FIG. 3 also shows the output of comparator 302 connected to level adjustor 315. FIG. 3 shows level adjustor 315 as comprising amplifier 316 where a first input of amplifier 316 is connected to the output of comparator 302 and a second input of amplifier 316 is coupled to DAC 314. FIG. 3 further shows the input of DAC 314 connected to reference voltage 336 and output of amplifier 316 latched by latch 318. In this example, output 338, the output of level adjustor 315, is coupled to the control module (e.g., control module 204, FIG. 2) such that the control module can analyze the adjusted current data. In some implementations, the reference voltage is selected by the control module such that the output current level is within a predetermined range.

In some embodiments, the current monitoring module comprises (1130) a comparator and an integrator, wherein the comparator has two inputs connected in parallel to the resistor network and wherein the integrator comprises a first input coupled to an output of the comparator, a second input coupled to a reference voltage, and an output coupled to the control module. The control module is further operable to analyze the output of the integrator as average current data. For example, FIG. 3 shows comparator 302 connected to the resistor network via inputs 301. FIG. 3 also shows the output of comparator 302 connected to integrator 306. FIG. 3 shows integrator 306 as comprising amplifier 308, capacitive element 310, and resistive element 309, where a first input of amplifier 308 is coupled to the output of comparator 302 via resistive element 309 and a second input of amplifier 308 is coupled to reference voltage 307. FIG. 3 further shows the output of amplifier 308 fed back to the first input of amplifier 308 via capacitive element 310. In this example, output 332, the output of integrator 306, is coupled to the control module (e.g., control module 204, FIG. 2) such that the control module can analyze the average current data. In practice, and as recognized by those of ordinary skill in the art, the integrator could comprise additional components (e.g., transistors, switches, and/or resistors).

The circuit, or management module 121 of the data storage system in conjunction with the circuit, in accordance with a determination that the recorded data meets the predetermined fault criteria, initiates (1132) one or more remedial actions, the one or more remedial actions including marking the specified portion of the storage device as a known-bad portion. In some implementations, marking the specified portion of the storage device as a known-bad portion comprises generating and/or updating metadata corresponding to the specified portion. In some implementations, a portion marked as a known-bad portion is excluded from future operations. In some implementations, the one or more remedial actions comprise adjusting one or more parameters associated with the specified portion (e.g., adjusting a voltage source supplied to the specified portion and/or adjusting clock timing supplied to the specified portion). In some implementations, the one or more remedial actions are coordinated by a management module (e.g., management module 121, FIG. 1). In some implementations, the one or more remedial actions comprise updating metadata corresponding to the specified portion of the storage device, including updating the metadata to mark the specified portion of the storage device as a known-bad portion. In some implementations, marking the specified portion of the storage device as a known-bad portion includes updating a mapping table of the storage device to indicate that the specified portion of the storage device should not be used. For example, mapping 600 in FIG. 6A indicates that portions 604-1 and 604-2 are known-bad portions.

In some embodiments, the control module is further operable (1134) to, in accordance with a determination that the one or more predefined characteristics meet the predetermined fault criteria, initiate one or more remedial actions. In some implementations, the control module coordinates with a management module (e.g., management module 121, FIG. 1) to initiate the one or more remedial actions.

In some embodiments, the one or more remedial actions comprise (1136) marking the array of data storage elements as a known-bad storage array. In some implementations, marking the array of data storage elements as a known-bad storage array includes updating a mapping table to indicate that the storage array should not be used in future operations. In some implementations, the mapping table is stored in a management module (e.g., memory 702 of management module 121, FIG. 7). In some implementations, the mapping table is stored in the control module (e.g., the control module comprises volatile memory and the mapping table is stored in the volatile memory).

In some embodiments, the circuit further comprises (1138) a second array of data storage elements, where the switching network is further operable to couple a specified portion of the resistor network to the second array of data storage elements. For example, FIG. 2 shows memory devices 212 (e.g., a first array of data storage elements) and memory devices 214 (e.g., a second array of data storage elements). In this example, memory devices 212 and memory devices 214 are coupled to switching network 208. In some implementations, a control module (e.g., control module 204) controls whether the switching network is coupled to the first array of data storage elements or the second array of data storage elements. In some implementations, the circuit comprises a plurality of data storage arrays and the switching network is operable to couple to each respective data storage array in the plurality of data storage arrays.

In some embodiments, the one or more remedial actions comprise (1140): determining whether data stored in the array of data storage elements is valid; and, in accordance with a determination that the data stored in the specified portion is valid, transferring the data stored in the array of data storage elements to the second array of data storage elements. For example, the array of data storage elements comprises a memory block (e.g., memory devices block 134-1, FIG. 1) and transferring the data stored in the array of data storage elements to a second array of data storage elements comprises transferring the data to a second memory block (e.g., memory devices block 134-*n*, FIG. 1). In some implementations, determining whether data stored in the array of data storage elements is valid comprises executing a read operation and evaluating the read data (e.g., comparing the read data with data from another source). In some implementations, determining whether data stored in the specified portion of the storage device is valid comprises evaluating metadata associated with the specified portion (e.g., a hash and/or checksum associated with the specified portion). In some implementations, an error control module (e.g., error control module 125, FIG. 1) determines whether data stored in the specified portion of the storage device is valid.

In some embodiments, the one or more remedial actions further comprise (1142), in accordance with a determination that the data stored in the array of data storage elements is invalid, obtaining recovered data corresponding to the data stored in the array of data storage elements and storing the recovered data to the second array of data storage elements. In some implementations, the circuit obtains recovered data from volatile memory (e.g., from volatile memory in control module 204). In some implementations, the circuit obtains recovered data from a third array of data storage elements. In some implementations, the recovered data comprises a previous version of the data stored in the array of data storage elements.

In some embodiments, the control module is further operable (1144) to: determine whether one or more predefined characteristics of the recorded data meets predetermined warning criteria and does not meet predetermined fault criteria; and, in accordance with a determination that the recorded data meets the predetermined warning criteria and does not meet predetermined fault criteria, initiate one or more predictive actions. In some implementations, meeting predetermined warning criteria indicates that, although the respective operation completed successfully, subsequent operations have an increased likelihood of failing. In some implementations, the predetermined warning criteria is stricter than the predetermined fault criteria such that recorded data that meets predetermined fault criteria always meets predetermined warning criteria as well. In some implementations, the one or more predictive actions comprise one or more of the remedial actions discussed previously.

In some embodiments, the one or more predictive actions comprise (1146) transferring the data stored in array of data storage elements to a second array of storage elements. For additional details regarding this aspect of method 1100 refer to the description of 1140.

In some embodiments, the one or more predictive actions comprise (1148) marking the array of data storage elements as a known-bad array. For additional details regarding this aspect of method 1100 refer to the description of 1136.

In some embodiments, the one or more predictive actions comprise (1150) updating metadata corresponding to the array of data storage elements. In some implementations, the metadata corresponding to the array of data storage elements is stored in the array. In some implementations, the metadata corresponding to the array of data storage elements is stored in volatile memory. In some implementations, the metadata corresponding to the array of data storage elements is stored in a second array of data storage elements. In some implementations, the metadata is first updated in volatile memory and then stored in non-volatile memory during a subsequent operation. In some implementations, the metadata corresponding to the array of data storage elements comprises metadata corresponding to subportions within the array (e.g., metadata corresponding to blocks, pages, sectors, zones, and/or planes); and updating the metadata corresponding to the array of data storage elements comprises updating the metadata corresponding to at least a subset of the subportions.

In some embodiments, updating the metadata includes flagging the array of data storage elements for use with low priority data only. For example, in some implementations, low priority data is data that is duplicated elsewhere. In some implementations, low priority data is data that can be reproduced if the array of data storage elements fails and the data stored in it is lost and/or corrupted. In some implementations, low priority data is determined by a management module (e.g., management module 121, FIG. 1). In some implementations, low priority data is determined by a host system (e.g., computer system 110, FIG. 1).

In some embodiments, updating the metadata includes flagging the array of data storage elements as being at risk of failing. In some implementations, portions flagged as being at risk of failing are fault checked more frequently than portions not flagged as being at risk of failing. For example, at risk arrays are fault checked every 100 operations and arrays not flagged as at risk are fault checked every 1000 operations. In some implementations, arrays flagged as being at risk of failing used only for data of low importance (e.g., low priority data). In some implementations, arrays flagged as being at risk of failing are used only for operations involving less dense amounts of data. For example, in some implementations, after being flagged as at risk of failing, the array is excluded from use in operations that involve more than half of the data storage elements comprising the array. In some implementations, arrays marked as being at risk of failing are used only for operations involving small amounts of data.

In some implementations, with respect to any of the methods described above, the circuit is a storage device. In some implementations, the storage device comprises a storage controller (e.g., storage controller 120, FIG. 1) and a storage medium (e.g., storage medium 132, FIG. 1).

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive elements, active elements, or both. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements included in a single device, such as memory elements located within and/or over the same substrate or in a single die, may be distributed in a two- or three-dimensional manner (such as a two dimensional (2D) memory array structure or a three dimensional (3D) memory array structure).

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer on which the material layers of the memory elements are deposited and/or in which memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, including a bit line and a word line.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked planes of memory devices. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single plane, sometimes called a horizontal (e.g., x-z) plane for ease of discussion. Alternatively, the memory elements may be connected together to extend through multiple parallel planes. Other three dimensional configurations can be envisioned wherein some NAND strings contain memory elements in a single plane of memory elements (sometimes called a memory level) while other strings contain memory elements which extend through multiple parallel planes (sometimes called parallel memory levels). Three dimensional memory arrays may also be designed in a NOR configuration and in a ReRAM configuration.

A monolithic three dimensional memory array is one in which multiple planes of memory elements (also called multiple memory levels) are formed above and/or within a single substrate, such as a semiconductor wafer, according to a sequence of manufacturing operations. In a monolithic 3D memory array, the material layers forming a respective memory level, such as the topmost memory level, are located on top of the material layers forming an underlying memory level, but on the same single substrate. In some implementations, adjacent memory levels of a monolithic 3D memory array optionally share at least one material layer, while in other implementations adjacent memory levels have intervening material layers separating them.

In contrast, two dimensional memory arrays may be formed separately and then integrated together to form a non-monolithic 3D memory device in a hybrid manner. For example, stacked memories have been constructed by forming 2D memory levels on separate substrates and integrating the formed 2D memory levels atop each other. The substrate of each 2D memory level may be thinned or removed prior to integrating it into a 3D memory device. As the individual memory levels are formed on separate substrates, the resulting 3D memory arrays are not monolithic three dimensional memory arrays.

Associated circuitry is typically required for proper operation of the memory elements and for proper communication with the memory elements. This associated circuitry may be on the same substrate as the memory array and/or on a separate substrate. As non-limiting examples, the memory devices may have driver circuitry and control circuitry used in the programming and reading of the memory elements.

Further, more than one memory array selected from 2D memory arrays and 3D memory arrays (monolithic or hybrid) may be formed separately and then packaged together to form a stacked-chip memory device. A stacked-chip memory device includes multiple planes or layers of memory devices, sometimes called memory levels.

The term "three-dimensional memory device" (or 3D memory device) is herein defined to mean a memory device having multiple layers or multiple levels (e.g., sometimes called multiple memory levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

A person skilled in the art will recognize that the invention or inventions descried and claimed herein are not limited to the two dimensional and three dimensional exemplary structures described here, and instead cover all relevant memory structures suitable for implementing the invention or inventions as described herein and as understood by one skilled in the art.

It will be understood that, although the terms "first," "second," etc. may be used herein to describe various elements, these elements should not be limited by these terms. These terms are only used to distinguish one element from another. For example, a first record could be termed a second record, and, similarly, a record could be termed a first record, without changing the meaning of the description, so long as all occurrences of the "first record" are renamed consistently and all occurrences of the "second record" are renamed consistently. The first record and the second record are both records, but they are not the same record.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A circuit to detect faults in one or more arrays of data storage elements, the circuit comprising:
    a resistor network comprising two or more resistors;
    a switching network for selectively coupling a respective portion of the resistor network to a first array of data storage elements, and the switching network is further operable to couple the respective portion of the resistor network to a second array of data storage elements;
    a current monitoring module connected to the resistor network, wherein the current monitoring module is operable to monitor current flow through the respective portion of the resistor network during performance of a respective operation on the first array of data storage elements, wherein the respective operations is a host-initiated memory read operation, host-initiated write operation, or data erase operation; and
    a control module coupled to the switching network and the current monitoring module;
        wherein the control module is operable to control the switching network, so as to couple the respective portion of the resistor network to the first array of data storage elements, and to determine whether one or more predefined characteristics of the output of the current monitoring module meet predetermined fault criteria; and
        wherein the control module is further operable to, in accordance with a determination that the one or more predefined characteristics meet the predetermined fault criteria, initiate one or more remedial actions, wherein the one or more remedial actions comprise:
            determining whether data stored in the first array of data storage elements is valid; and
            in accordance with a determination that the data stored in the first array of data storage elements is valid, transferring the data stored in the first array of data storage elements to the second array of data storage elements.

2. The circuit of claim 1, wherein:
    the current monitoring module comprises a comparator and an amplifier, wherein the comparator is connected to the resistor network and wherein the amplifier comprises a first input coupled to an output of the comparator, a second input coupled to a reference voltage, and an output coupled to the control module; and
    the control module is further operable to analyze the output of the amplifier as instantaneous current data.

3. The circuit of claim 1, wherein:
    the current monitoring module comprises a comparator and an amplifier, wherein the comparator is connected to the resistor network and wherein the amplifier comprises a first input coupled to an output of the comparator, a second input coupled to sample and hold circuitry, and an output coupled to the sample and hold circuitry and the control module; and
    the control module is further operable to analyze the output of the amplifier as peak current data.

4. The circuit of claim 1, wherein:
    the current monitoring module comprises a first comparator, a second comparator, and a digital to analog converter (DAC), wherein the first comparator is connected to the resistor network, wherein the DAC comprises a first input coupled to a reference voltage and an output coupled to the second comparator, and wherein the second comparator comprises a first input coupled to the output of the first comparator, a second input coupled to the output of the DAC, and an output coupled to the control module; and
    the control module is further operable to analyze the output of the second comparator as adjusted current data.

5. The circuit of claim 1, wherein:
    the current monitoring module comprises a comparator and an integrator, wherein the comparator is connected to the resistor network and wherein the integrator comprises a first input coupled to an output of the comparator, a second input coupled to a reference voltage, and an output coupled to the control module; and
    the control module is further operable to analyze the output of the integrator as average current data.

6. The circuit of claim 1, wherein the one or more remedial actions comprise marking the first array of data storage elements as a known-bad storage array.

7. The circuit of claim 1, wherein the plurality of arrays of data storage elements comprise arrays of non-volatile data storage elements.

8. The circuit of claim 7, wherein the one or more remedial actions further comprise, in accordance with a determination that the data stored in the first array of data storage elements is invalid, obtaining recovered data corresponding to the data stored in the first array of data storage elements and storing the recovered data to the second array of data storage elements.

9. A circuit to detect faults in one or more arrays of data storage elements, the circuit comprising:
    a resistor network comprising two or more resistors;
    a switching network for selectively coupling a respective portion of the resistor network to a first array of data storage elements;
    a current monitoring module connected to the resistor network, wherein the current monitoring module is operable to monitor current flow through the respective portion of the resistor network; and
    a control module coupled to the switching network and the current monitoring module;
        wherein the control module is operable to control the switching network, so as to couple the respective portion of the resistor network to the first array of data storage elements, and to determine whether one or more predefined characteristics of the output of the current monitoring module meet predetermined fault criteria;

wherein the control module is further operable to, in accordance with a determination that the one or more predefined characteristics meet the predetermined fault criteria, initiate one or more remedial actions; and wherein the control module is further operable to:
  determine whether one or more predefined characteristics of the recorded data meet predetermined warning criteria and do not meet predetermined fault criteria; and
  in accordance with a determination that the one or more predefined characteristics of the recorded data meet the predetermined warning criteria and do not meet the predetermined fault criteria, initiate one or more predictive actions.

10. The circuit of claim 9, wherein the one or more predictive actions comprise transferring the data stored in the first array of data storage elements to a second array of storage elements.

11. The circuit of claim 9, wherein the one or more predictive actions comprise marking the first array of data storage elements as a known-bad storage array.

12. The circuit of claim 9, wherein the one or more predictive actions comprise updating metadata corresponding to the first array of data storage elements.

13. A storage device configured to detect faults in data storage elements, the storage device comprising:
  one or more arrays of data storage elements;
  a resistor network comprising two or more resistors;
  a switching network for selectively coupling a respective portion of the resistor network to a first array of data storage elements, and the switching network is further operable to couple the respective portion of the resistor network to a second array of data storage elements;
  a current monitoring module connected to the resistor network, wherein the current monitoring module is operable to monitor current flow through the respective portion of the resistor network during performance of a respective operation on the first array of data storage elements, wherein the respective operations is a host-initiated memory read operation, host-initiated write operation, or data erase operation; and
  a control module coupled to the switching network and the current monitoring module;
    wherein the control module is operable to control the switching network, so as to couple the respective portion of the resistor network to the first array of data storage elements, and to determine whether one or more predefined characteristics of the output of the current monitoring module meet predetermined fault criteria; and
    wherein the control module is further operable to, in accordance with a determination that the one or more predefined characteristics meet the predetermined fault criteria, initiate one or more remedial actions, wherein the one or more remedial actions comprise:
      determining whether data stored in the first array of data storage elements is valid; and
      in accordance with a determination that the data stored in the first array of data storage elements is valid, transferring the data stored in the first array of data storage elements to the second array of data storage elements in the one or more arrays of data storage elements.

14. The storage device of claim 13, wherein:
  the current monitoring module comprises a comparator and an amplifier, wherein the comparator is connected to the resistor network and wherein the amplifier comprises a first input coupled to an output of the comparator, a second input coupled to a reference voltage, and an output coupled to the control module; and
  the control module is further operable to analyze the output of the amplifier as instantaneous current data.

15. The storage device of claim 13, wherein:
  the current monitoring module comprises a comparator and an amplifier, wherein the comparator is connected to the resistor network and wherein the amplifier comprises a first input coupled to an output of the comparator, a second input coupled to sample and hold circuitry, and an output coupled to the sample and hold circuitry and the control module; and
  the control module is further operable to analyze the output of the amplifier as peak current data.

16. The storage device of claim 13, wherein:
  the current monitoring module comprises a first comparator, a second comparator, and a digital to analog converter (DAC), wherein the first comparator is connected to the resistor network, wherein the DAC comprises a first input coupled to a reference voltage and an output coupled to the second comparator, and wherein the second comparator comprises a first input coupled to the output of the first comparator, a second input coupled to the output of the DAC, and an output coupled to the control module; and
  the control module is further operable to analyze the output of the second comparator as adjusted current data.

17. The storage device of claim 13, wherein:
  the current monitoring module comprises a comparator and an integrator, wherein the comparator is connected to the resistor network and wherein the integrator comprises a first input coupled to an output of the comparator, a second input coupled to a reference voltage, and an output coupled to the control module; and
  the control module is further operable to analyze the output of the integrator as average current data.

18. The storage device of claim 13, wherein the plurality of arrays of data storage elements comprise arrays of non-volatile data storage elements.

19. The storage device of claim 13, wherein the one or more remedial actions further comprise, in accordance with a determination that the data stored in the first array of data storage elements is invalid, obtaining recovered data corresponding to the data stored in the first array of data storage elements and storing the recovered data to the second array of data storage elements.

20. A storage device configured to detect faults in data storage elements, the storage device comprising:
  one or more arrays of data storage elements;
  a resistor network comprising two or more resistors;
  a switching network for selectively coupling a respective portion of the resistor network to a first array of data storage elements in the one or more arrays of data storage elements;
  a current monitoring module connected to the resistor network, wherein the current monitoring module is operable to monitor current flow through the respective portion of the resistor network; and
  a control module coupled to the switching network and the current monitoring module;
    wherein the control module is operable to control the switching network, so as to couple the respective portion of the resistor network to the first array of data storage elements, and to determine whether one or more predefined characteristics of the output of the current monitoring module meet predetermined fault criteria;

wherein the control module is further operable to, in accordance with a determination that the one or more predefined characteristics meet the predetermined fault criteria, initiate one or more remedial actions; and wherein the control module is further operable to:
  determine whether one or more predefined characteristics of the recorded data meet predetermined warning criteria and do not meet predetermined fault criteria; and
  in accordance with a determination that the more predefined characteristics of the recorded data meet the predetermined warning criteria and do not meet the predetermined fault criteria, initiate one or more predictive actions.

21. The storage device of claim 20, wherein the one or more predictive actions comprise transferring the data stored in the first array of data storage elements to a second array of storage elements in the one or more arrays of data storage elements.

22. The storage device of claim 20, wherein the one or more predictive actions comprise marking the first array of data storage elements as a known-bad storage array.

23. The storage device of claim 20, wherein the one or more predictive actions comprise updating metadata corresponding to the first array of data storage elements.

* * * * *